United States Patent
Daneman et al.

(10) Patent No.: US 10,532,926 B2
(45) Date of Patent: Jan. 14, 2020

(54) METHODS FOR CMOS-MEMS INTEGRATED DEVICES WITH MULTIPLE SEALED CAVITIES MAINTAINED AT VARIOUS PRESSURES

(71) Applicant: INVENSENSE, INC., San Jose, CA (US)

(72) Inventors: Michael Daneman, Campbell, CA (US); Martin Lim, San Mateo, CA (US); Kegang Huang, Fremont, CA (US); Igor Tchertkov, San Jose, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 15/358,956

(22) Filed: Nov. 22, 2016

(65) Prior Publication Data
US 2017/0297907 A1 Oct. 19, 2017

Related U.S. Application Data

(62) Division of application No. 13/535,180, filed on Jun. 27, 2012, now Pat. No. 9,540,230.
(Continued)

(51) Int. Cl.
*B81B 7/02* (2006.01)
*B81C 1/00* (2006.01)

(52) U.S. Cl.
CPC .............. *B81B 7/02* (2013.01); *B81C 1/0023* (2013.01); *B81C 1/00293* (2013.01); *B81C 2203/019* (2013.01); *B81C 2203/0145* (2013.01)

(58) Field of Classification Search
CPC .......... H01L 23/02; H01L 21/54; H01L 29/84; H01L 21/04
(Continued)

(56) References Cited

U.S. PATENT DOCUMENTS 5,285,131 A 2/1994 Muller et al.
5,493,177 A 2/1996 Muller et al.
(Continued)

FOREIGN PATENT DOCUMENTS

CN 101898746 12/2010
CN 103183308 7/2013
(Continued)

OTHER PUBLICATIONS

Taiwan Office Action dated Mar. 14, 2017 for Taiwan Application No. 104132144, 6 pages (with translation).
(Continued)

*Primary Examiner* — Mouloucoulaye Inoussa
(74) *Attorney, Agent, or Firm* — Amin, Turocy & Watson, LLP

(57) ABSTRACT

A Microelectromechanical systems (MEMS) structure comprises a MEMS wafer. A MEMS wafer includes a handle wafer with cavities bonded to a device wafer through a dielectric layer disposed between the handle and device wafers. The MEMS wafer also includes a moveable portion of the device wafer suspended over a cavity in the handle wafer. Four methods are described to create two or more enclosures having multiple gas pressure or compositions on a single substrate including, each enclosure containing a moveable portion. The methods include: A. Forming a secondary sealed enclosure, B. Creating multiple ambient enclosures during wafer bonding, C. Creating and breaching an internal gas reservoir, and D. Forming and subsequently sealing a controlled leak/breach into the enclosure.

19 Claims, 44 Drawing Sheets

Related U.S. Application Data

(60) Provisional application No. 61/501,652, filed on Jun. 27, 2011.

(58) Field of Classification Search
USPC ........ 257/415, 414, 416, 417, E23.193, 723, 257/E23.18, E21.501; 438/48–52, 438/455–459, 476
See application file for complete search history.

(56) References Cited

U.S. PATENT DOCUMENTS

| | | | |
|---|---|---|---|
| 5,531,121 | A | 7/1996 | Sparks et al. |
| 6,936,491 | B2 | 8/2005 | Partridge et al. |
| 7,008,812 | B1 | 3/2006 | Carley |
| 7,075,160 | B2 | 7/2006 | Partridge et al. |
| 7,104,129 | B2 | 7/2006 | Nasiri et al. |
| 7,442,570 | B2 | 10/2008 | Nasiri et al. |
| 8,328,966 | B1 | 12/2012 | Laib et al. |
| 9,067,779 | B1 | 6/2015 | Rothenberg |
| 2003/0231967 | A1 | 12/2003 | Najafi et al. |
| 2004/0077117 | A1 | 4/2004 | Ding |
| 2004/0166385 | A1 | 8/2004 | Morse |
| 2006/0208326 | A1 | 9/2006 | Nasiri et al. |
| 2009/0294879 | A1 | 12/2009 | Bhagavat et al. |
| 2010/0025845 | A1 | 2/2010 | Merz et al. |
| 2011/0079425 | A1 | 4/2011 | Baillin et al. |
| 2011/0121412 | A1* | 5/2011 | Quevy ............ B81B 7/02 257/415 |
| 2012/0043627 | A1 | 2/2012 | Lin et al. |
| 2012/0279302 | A1 | 11/2012 | Lim |
| 2012/0326248 | A1 | 12/2012 | Daneman et al. |
| 2014/0225206 | A1 | 8/2014 | Lin et al. |
| 2015/0129991 | A1 | 5/2015 | Lee et al. |
| 2015/0360939 | A1 | 12/2015 | Zhang et al. |

FOREIGN PATENT DOCUMENTS

| | | |
|---|---|---|
| CN | 103253625 | 8/2013 |
| DE | 102012202183 A1 | 8/2013 |
| TW | I396659 | 5/2013 |

OTHER PUBLICATIONS

Office Action dated Dec. 23, 2013 for U.S. Appl. No. 13/535,180, 19 pages.
Office Action dated Oct. 7, 2014 for U.S. Appl. No. 13/535,180, 21 pages.
Office Action dated Mar. 27, 2015 for U.S. Appl. No. 13/535,180, 21 pages.
Office Action dated Oct. 7, 2015 for U.S. Appl. No. 13/535,180, 22 pages.
Office Action dated May 6, 2016 for U.S. Appl. No. 13/535,180, 25 pages.
European Search Report dated Mar. 8, 2016 for European Application Serial No. 15188710.6-1504, 8 pages.
Office Action dated Apr. 10, 2014 for U.S. Appl. No. 13/535,180, 31 pages.
Chinese Office Action dated Sep. 23, 2016 for Chinese Application Serial No. 201510646926.2, 7 pages.
Office Action dated Feb. 26, 2016 for U.S. Appl. No. 14/603,185, 27 pages.
Office Action dated Sep. 22, 2016 for U.S. Appl. No. 14/603,185, 32 pages.
Office Action dated Feb. 17, 2016 for U.S. Appl. No. 14/598,138, 31 pages.
Office Action dated Oct. 11, 2016 for U.S. Appl. No. 14/598,138, 16 pages.
Ex Parte Quayle Action dated Jan. 25, 2017 for U.S. Appl. No. 15/265,668, 31 pages.
Notice of Allowance dated Apr. 13, 2017 for U.S. Appl. No. 15/265,668, 39 pages.
Chinese Office Action dated Jun. 1, 2017 for Chinese Application Serial No. 201510646926.2, 7 pages.
Office Action dated Sep. 22, 2017 for U.S. Appl. No. 15/461,270, 46 pages.

* cited by examiner

METHODS FOR CMOS-MEMS INTEGRATED DEVICES WITH MULTIPLE SEALED CAVITIES MAINTAINED AT VARIOUS PRESSURES

PRIORITY CLAIM

This patent application is a divisional application that claims priority to U.S. patent application Ser. No. 13/535,180, filed Jun. 27, 2012, entitled "METHODS FOR CMOS-MEMS INTEGRATED DEVICES WITH MULTIPLE SEALED CAVITIES MAINTAINED AT VARIOUS PRESSURES," which is a non-provisional application that claims priority to U.S. Provisional Patent Application No. 61/501,652, filed on Jun. 27, 2011, entitled "MEMS DEVICES, INTEGRATED MEMS-CMOS," the entireties of which are incorporated by reference herein.

TECHNICAL FIELD

The present invention relates generally to MEMS (Microelectromechanical systems) devices and more particularly relates to MEMS devices that are hermetically sealed.

BACKGROUND

MEMS technology has advanced to provide integrated packaging of the MEMS devices or sensors. This integration advancement typically refers to processes or methods at which the packaging of the MEMS device is in the form of a protective cap which hermetically seals the device from the outside environment. Furthermore it protects the MEMS device from subsequent assembly operations such as saw cutting for singulation. The processes and methods are performed at a wafer level rather than a die level. The wafer level integration offers a more efficient and cost effective manner to package the MEMS devices. One such wafer level packaging technique is the Nasiri-Fabrication platform depicted in FIG. 1. In FIG. 1, the Nasiri-Fabrication (NF) platform uses a patented wafer-to-wafer bonding process 100 that directly integrates pre-fabricated MEMS wafers 110 to off-the-shelf complementary metal-oxide semiconductor (CMOS) wafers 120 at the wafer level. The process also simultaneously provides electric contact and hermetic sealing 130 of all MEMS elements at the wafer level.

Using the process, which uses six masks, engineered silicon on insulator (ESOI) wafer 150 is formed starting with a standard silicon handle wafer etched with targets for backside alignment (mask 1); followed by oxidation and cavity etch (mask 2). A second wafer is fusion bonded to the handle wafer and subsequently thinned to define the device layer thickness. The MEMS wafer 110 is completed by etching the device layer to form standoffs (mask 3) that define the seal ring, the electrical contacts to CMOS, and the vertical gap between the CMOS and MEMS; depositing and patterning a germanium layer (mask 4) over standoffs; and patterning (mask 5) and deep reactive ion etching the device layer to form the mechanical structure 135.

Continuing, a standard CMOS wafer is fabricated, with optional etched cavities (mask 6), if needed for larger clearance under moving MEMS structures. The MEMS wafer is bonded to the CMOS wafer using AlGe eutectic bonding between the Al on the CMOS and the Ge on the MEMS wafer at 140, for example. After bonding, a portion of the MEMS wafer is removed by conventional dicing saw cuts to expose the CMOS wire bond pads 125.

While the Nasiri-Fabrication process is ideally suited for operational environments as is proven by the success of the process today, it is often desirable to have different devices sealed at different pressures or different gas compositions when integrating multiple MEMS devices on the same chip. It will be recognized by those skilled in the art that such a need may arise where, for instance, different devices are sought to be optimized for different pressures or where different devices may require different ambient gasses or pressures (hereby referred to as ambient or ambients) to operate.

Other attempts to provide for a sealed element, such as that of U.S. Pat. No. 5,285,131 disclose steps to create a MEMS element sealed in an enclosure using two capping layers and a sacrificial layer. Similarly, U.S. Pat. Nos. 6,936,491 and 7,075,160 further disclose the addition of an insulated via to make electrical contact to the underlying silicon (the latter method not taught or required for this invention).

Unfortunately, these attempts do not overcome the challenges encountered when integrating multiple MEMS devices on a single chip, where it is often desirable to have different devices sealed at different pressures involving minimal processing steps, achieving a more predictable outcome through improved control, and having reduced requirements for the commodity of space or "real estate." Similarly, what is desired is a system and method that overcomes these challenges and provides for two or more cavities with different pressures or requiring different ambient gasses for operation on the same chip involving a wafer bonding technique. Further what is needed is a system and method providing for the integration of such devices into an integrated CMOS-MEMS to create multi-ambient devices.

SUMMARY

The present invention fulfills these needs and has been developed in response to the present state of the art, and in particular, in response to the problems and needs in the art that have not yet been fully solved by currently available technologies.

One embodiment of the present invention (Approach A) provides for two sealed enclosures through two different enclosure methods. One enclosure is achieved through conventional Nasiri Fabrication wafer bonding and a secondary enclosure is formed through a wafer encapsulation method comprising of deposited structural and sacrificial materials to construct a shell like enclosure. This embodiment comprises: a MEMS wafer including: a handle wafer with cavities bonded to a device wafer through a dielectric layer disposed between the handle and device wafers; a moveable portion of the device wafer suspended over a cavity in the handle wafer; a capping layer attached to the device wafer and separated by an air gap from the moveable portion of the device wafer, to form a first enclosure with a first ambient pressure. A second enclosure with a second ambient pressure is formed through CMOS-MEMS wafer bonding on another movable portion of the device wafer. The second enclosure can but is not restricted to enclose the first enclosure.

Another embodiment of the present invention (Approach B) provides for a method for integrating two sealed enclosures for each of two MEMS devices each having a silicon device layer, whereby the process creates a first enclosure and a second enclosure using wafer bonding, comprising the steps of: using a standard Nasiri-Fabrication (NF) process up to and including Stand-off Etch, processing a wafer; patterning and etching the silicon device layer and finally integrating to CMOS through a wafer bonding process. The environment of each enclosure, including its gas species and pressure, is controlled during the wafer bonding process where each enclosure is sealed. Several methods are considered including methods where the sealing is performed at different times during the wafer bonding process. A second approach to establish multiple pressures during the wafer bonding involves a method where a material is included in one of the enclosures that can absorb (getter) or desorb (outgas) gas molecules which can affect the pressure. In the case where the material has absorptive properties (getter) the pressure would decrease and in the case of desorptive properties (outgas) the pressure will increase. Accordingly, it can be understood that, with the second approach, after sealing, the environment of a sealed enclosure for an exemplary MEMS device can have a higher cavity pressure (where a material is included in the sealed enclosure that can desorb (outgas) gas molecules) as a result of desorption of gas molecules than another of the sealed enclosures that does not include an out-gassing substance. It can be further understood that, after sealing, the environment of the sealed enclosure for an exemplary MEMS device can have a lower cavity pressure (where a material is included in the sealed enclosure that can absorb (getter) gas molecules) as a result of absorption of gas molecules than another of the sealed enclosures that does not include a gettering substance.

Another embodiment of the invention (Approach C) provides for an internal gas reservoir for one of the sealed enclosures to tap into after wafer bonding. The internal gas reservoir comprises a sealed cavity during the Engineered SOI wafer formation of the Nasiri fabrication process. The pressure of the sealed cavity and the desired ambient gas can be sealed into the gas reservoir cavities during the fusion bonding step of the Nasiri Fabrication process of forming the engineered SOI wafer. This sealed cavity or reservoir is then connected to one of the sealed enclosures to control the enclosure's final pressure or gas composition. The connection method is similar to an electrical fuse where in this embodiment a flow channel fuse is opened to connect the sealed enclosure to the reservoir. The method can include applying thermal energy to create the opening such as focused laser ablation or Joule heating. The laser ablation may include a focused beam where the energy is concentrated to a certain depth.

A further embodiment of the present invention (Approach D) provides for a method for integrating a secondary sealed enclosure in parallel with a main sealed enclosure. The pressure and ambient gas in the main enclosure is determined during wafer bonding process and the pressure in the secondary sealed enclosure is determined by a post bond sealing of a designed breach or channel of the second enclosure. The post bond process will expose the enclosure to the appropriate pressure and then seal it at that pressure. Each enclosure initially has approximately the same pressure, comprising the steps of: processing a wafer using the Nasiri Fabrication process to create one or more pressure ports. A controlled breach is then created in the second enclosure, and the wafer is then sealed in an ambient that is desirable for the second enclosure. The sealing process operating pressure defines the pressure of the second enclosure. An extension of this embodiment is to design the port to comprise a channel having a gas flow resistance between the port and a secondary enclosure. The flow resistance provides a slow conductance path for a gas to flow into or out of the enclosure. The conductance is then a function of the pressure differential which can be applied in a step separate from the final sealing step. The resistance path is designed to be conductive or flowable for a larger pressure differential but can be relatively non-flowing at pressure differentials less than one atmosphere. A high pressure source is envisioned to provide the necessary pressure differential to push desired gas into or out of the secondary enclosure. Alternately, a sufficiently long exposure at a lower pressure differential may be sufficient to achieve the desired pressure inside the second enclosure. This provides a greater flexibility of pressure values for the second enclosure where the pressure and ambient gas are not dependent on the sealing process.

Other aspects and advantages of the present invention will become apparent from the following detailed description, taken in conjunction with the accompanying drawings, illustrating by way of example the principles of the invention.

DETAILED DESCRIPTION

The present invention relates generally to the fabrication of MEMS devices, and more particularly to providing for two or more cavities with different pressures, or requiring different ambient gasses for operation, on the same chip involving a wafer bonding technique. The present invention provides for multiple approaches and methods for creating multiple pressure levels in multiple cavities fabricated on the chip by a process such as an NF process.

Approach Comparisons

The present invention relates generally to MEMS devices and more particularly relates to MEMS devices that are hermetically sealed. Presented are four methods, which are described below and include: A. Secondary sealed enclosure, B. Multiple ambient enclosures created during wafer bonding (with four approaches), C. Internal gas reservoir, and D. Controlled leak/breach (with three approaches). Table 1 presents a generalized summary of the advantages of each method and approach.

TABLE 1

Comparison of several approaches

| Approach | Advantage | General Comment |
| --- | --- | --- |
| A: Secondary sealed enclosure | One regular pressure and one very low pressure | creates a first enclosure prior to bonding using additional deposition steps and the second enclosure using wafer bonding |
| B: Multiple ambient enclosures | Simplest approach | creates two or more cavities with different pressures or ambients during the wafer bonding process |
| C: Internal gas reservoir | More control, multiple pressures/ multiple gasses; Fewer additional process steps | creates a secondary pressure cavity by including a gas reservoir near the main enclosure which is breached after wafer bonding. |
| D: Controlled leak/breach | multiple pressures/ multiple gasses | keeps one cavity open to the environment after wafer bonding (or alternately opens a channel into that cavity after wafer bonding) which is later sealed at the desired secondary pressure or ambient |

Figure 1:
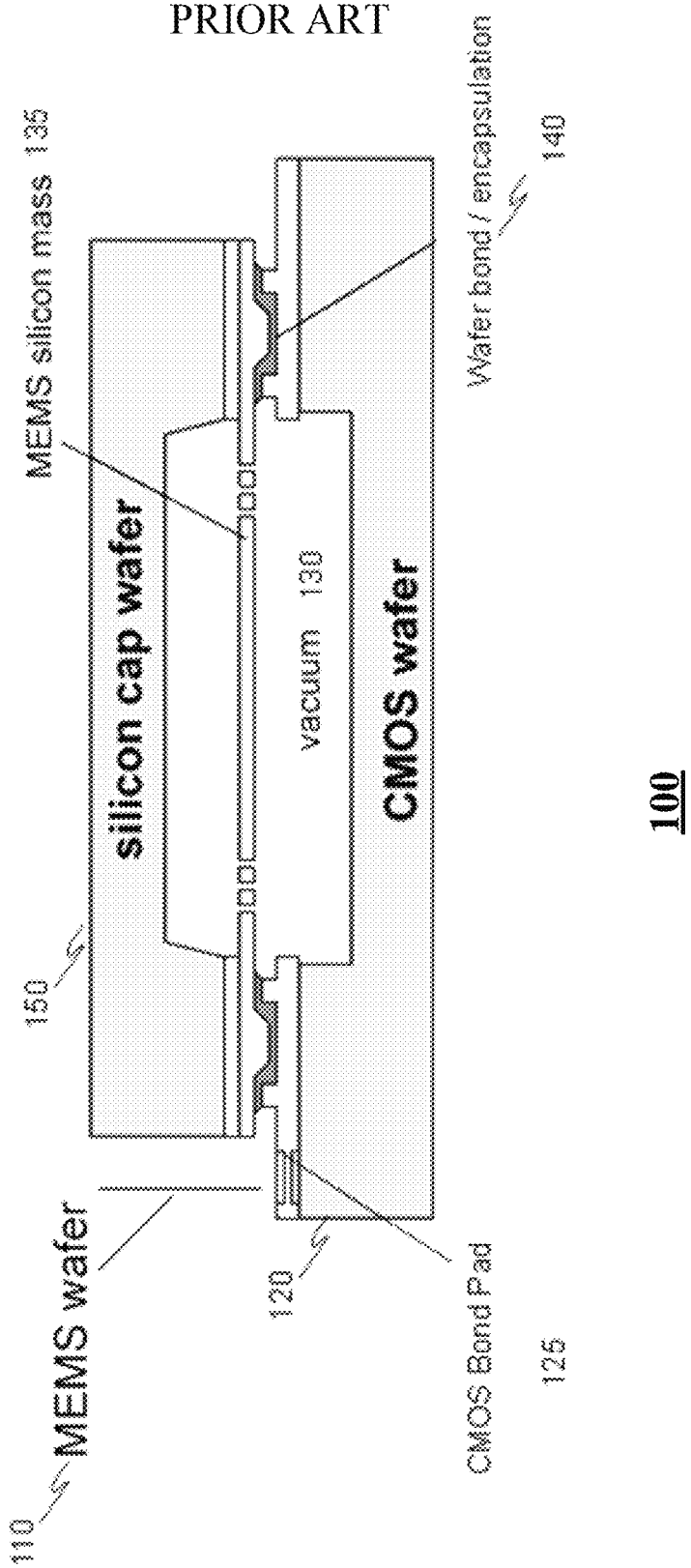
FIG. 1 depicts a typical cross-section of a Nasiri-Fabrication platform device.

The process described in FIG. 1 provides for the fabrication of CMOS-MEMS integrated devices using eutectic wafer bonding to create a sealed enclosure between the MEMS and CMOS wafers as well as to make electrical interconnection between the MEMS device and CMOS circuits. A method and system in accordance with the present invention provides for the integration of two or more MEMS devices that require different operating pressures or ambient gasses in operation. For example, MEMS resonators which typically require a low and stable pressure may be integrated with inertial sensors such as accelerometers or gyroscopes which require a higher pressure to operate. In one or more embodiments, a method and system in accordance with the present invention provides for the integration of multiple devices, such as one or more of one or more MEMS resonators, MEMS sensors, MEMS inertial sensors, and/or other MEMS structures, and so on, as available to one skilled in the art, into an integrated CMOS-MEMS process in order to create multiple ambients for multiple devices. It further provides a means for electrical interconnection of the enclosed MEMS devices and, optionally, the capping layer(s) to MEMS structures outside of the enclosure and to a CMOS wafer. A method in accordance with the present invention, in one or more embodiments, in one or more approaches, provides for a method for integrating a second sealed enclosure alongside the main sealed enclosure. Below are provided a variety of approaches available with a method and system in accordance with the present invention, in one or more embodiments, providing for the integration of such devices into an integrated CMOS-MEMS to create multi-ambient devices. In the described embodiments, the CMOS wafer may be replaced by any suitable capping wafer or substrate.

For each of the approaches, it will be appreciated that a MEMS structure comprises a MEMS wafer. A MEMS wafer includes a handle wafer with cavities bonded to a device wafer through a dielectric layer disposed between the handle and device wafers. The bonding of the device wafer and subsequent thinning of the device wafer produces an intermediate stage of the process referred to as an Engineered Silicon on Insulator wafer where cavities in the handle wafer are sealed by a layer of the device wafer. The MEMS wafer also includes a moveable portion of the device wafer suspended over a cavity in the handle wafer. The MEMS wafer includes standoffs that are defined by selectively removing areas of the device wafer to product protrusions or standoffs of the device layer. A germanium material is then disposed over these standoffs and will be used to adhere a CMOS wafer to the MEMS wafer through aluminum to germanium bonding. Prior to bonding the MEMS wafer also includes a moveable portion of the device wafer suspended over a cavity in the handle wafer. These portions are typically defined by a lithographic masking and etch steps.

The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, a method and system in accordance with the present invention is not intended to be limited to the embodiment shown but is to be accorded the widest scope consistent with the principles and features described herein.

A method in accordance with the present invention provides a series of approaches for methods for producing two or more cavities with different pressures or ambient on the same chip using wafer bonding.

A. Secondary Sealed Enclosure Approach

FIGS. 2-14 set forth a process for integrating a secondary sealed enclosure in addition to the main sealed enclosure, in accordance with one or more embodiments, whereby the process creates a first enclosure prior to bonding using additional deposition steps and a second enclosure using wafer bonding.

Figure 2:
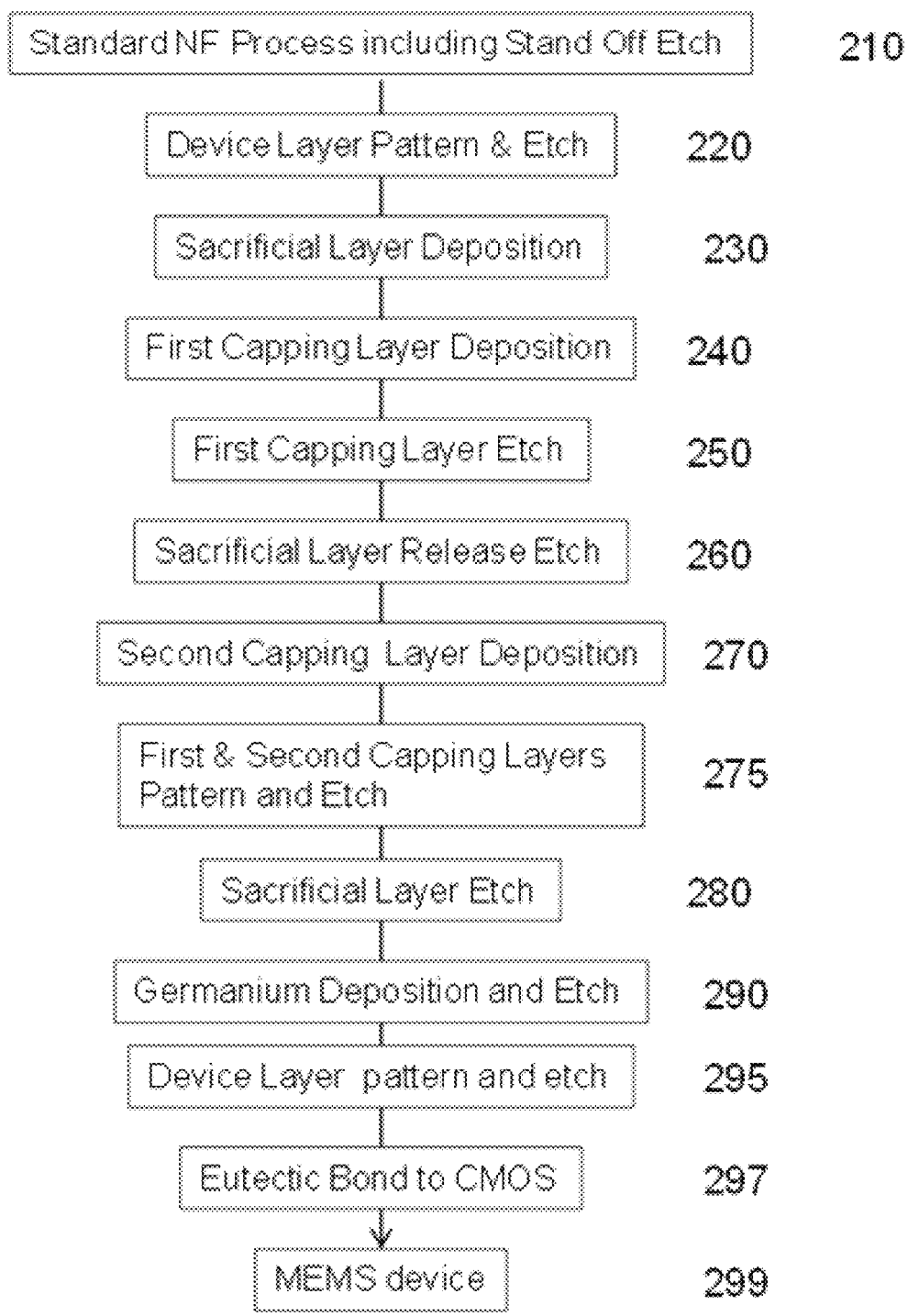
FIG. 2 sets forth a process for integrating a secondary sealed enclosure in addition to the main sealed enclosure, in accordance with one or more embodiments.

FIG. 2 sets forth a process 200 for integrating a secondary sealed enclosure in addition to the main sealed enclosure, in accordance with one or more embodiments.

Figure 3:
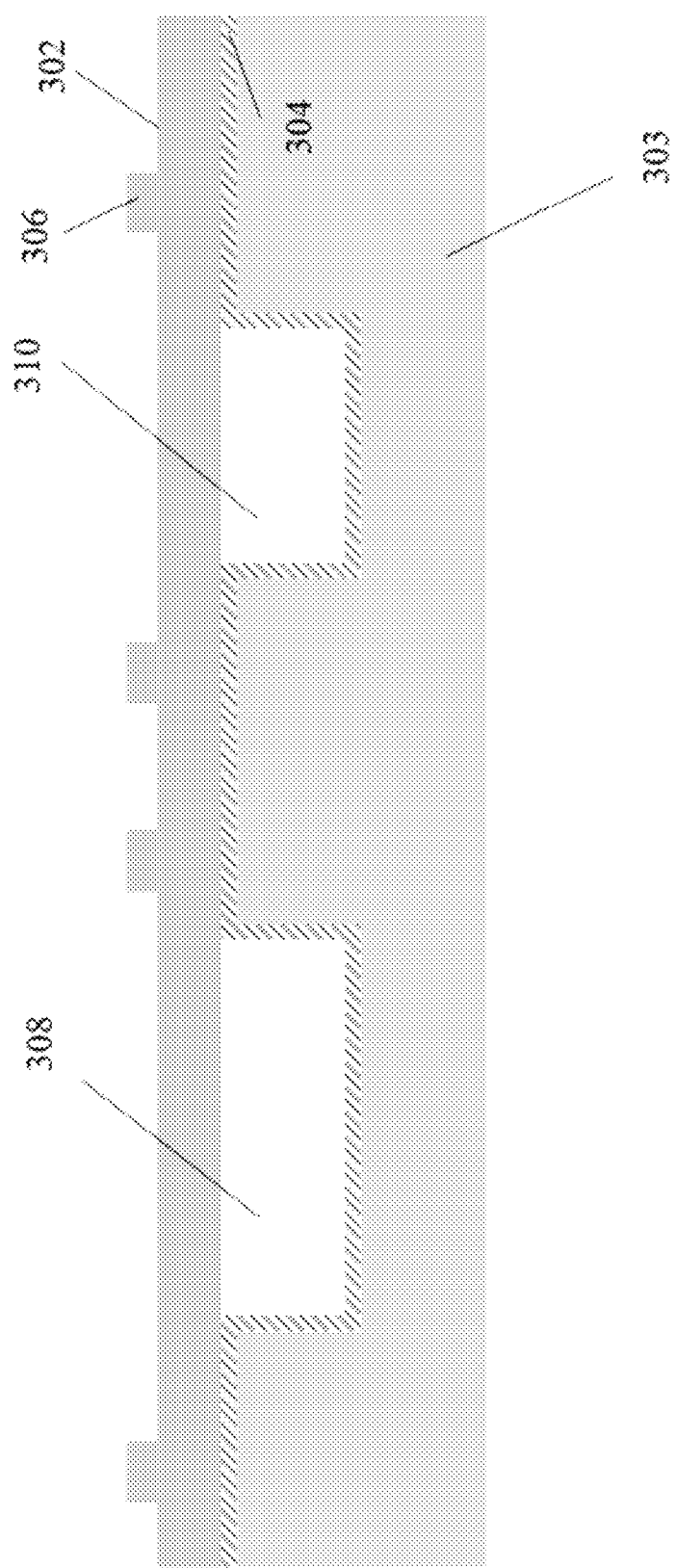
FIG. 3 illustrates a MEMS wafer processed through the Nasiri-Fabrication (NF) process through Stand-Off etch, which acts as starting material for the process described in FIG. 2.
Figure 4:
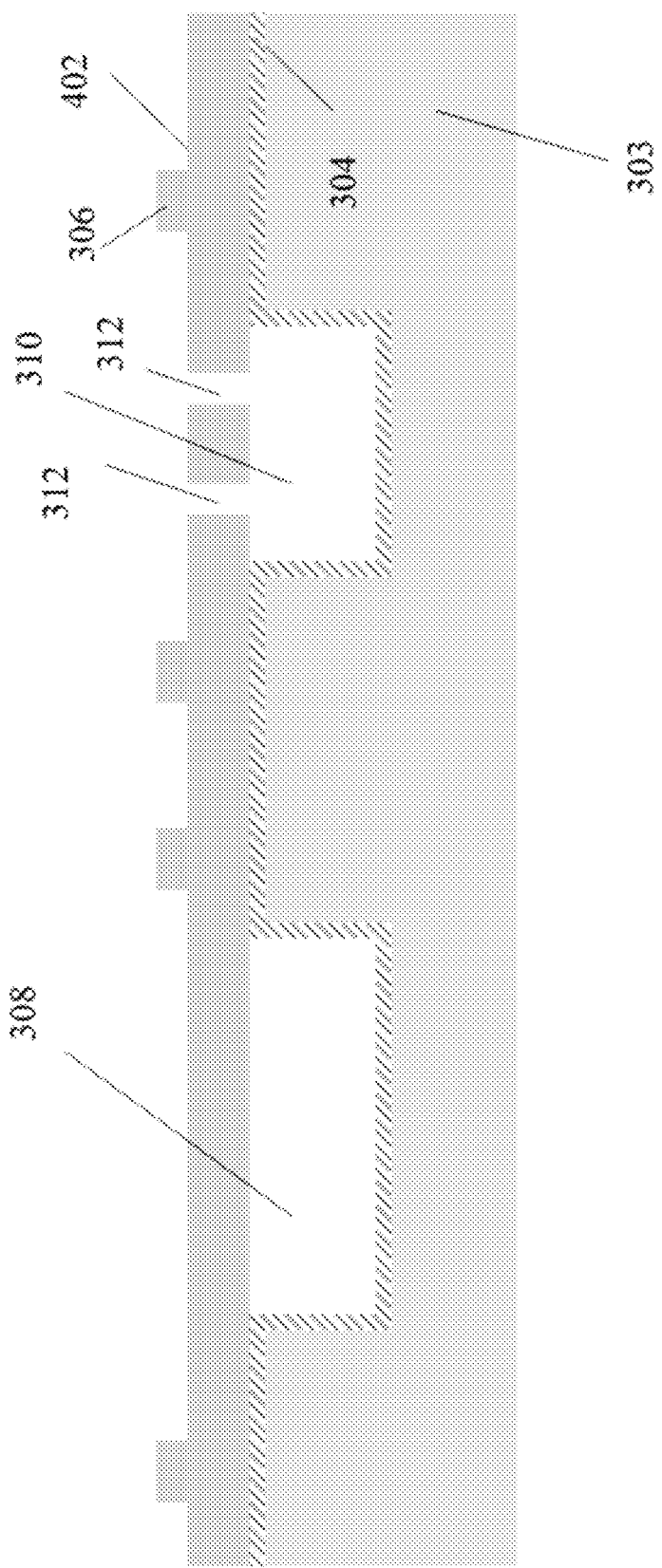
FIG. 4 illustrates the step for the device layer pattern and Deep Reactive Ion Etch (DRIE).
Figure 5:
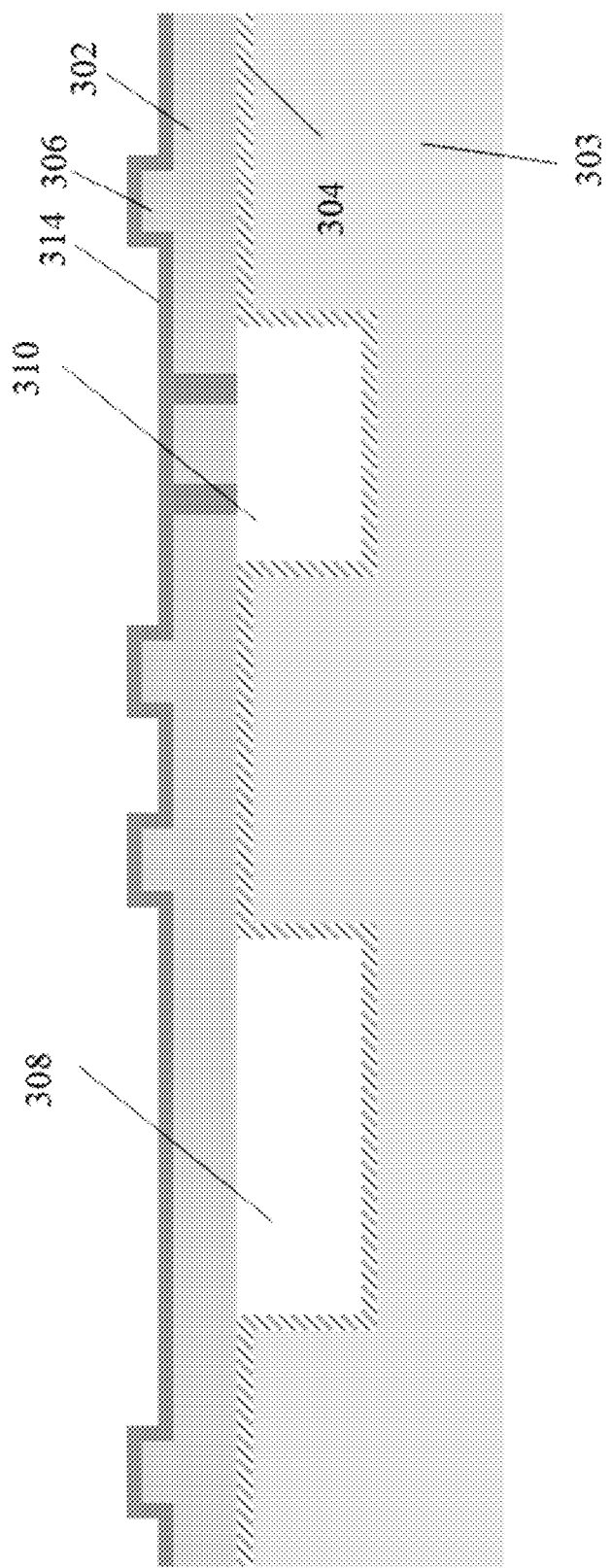
FIG. 5 illustrates a step providing for an silicon oxide deposition of sufficient thickness to plug the openings in the device layer.

From FIG. 2 and FIG. 3, the wafer is processed in accordance with the standard NF process up to and including Stand-off Etch at 210. The starting wafer provides a silicon device layer 302 bonded to a silicon handle wafer 303 through an insulating layer 304 situated between the device layer and handle wafer, and stand-offs 306 formed from the device layer. Once the wafer has been processed up to and including Stand-off Etch, the silicon device layer 302 is patterned and etched to define the MEMS devices to be sealed in the separate enclosure at 220 (FIG. 4). Preferably at 220, the openings 312 in the device layer are sufficiently narrow or are further processed to be so in preparation to be sealed by a conformal or partially conformal deposition of the sacrificial layer 314 deposited in the following step. At 230 a sacrificial spacer layer 314 (e.g., silicon oxide, etc.) is deposited onto the wafer to a predetermined and sufficient thickness so as to plug (i.e., pinch-off) openings 312 created in the device layer from the previous silicon etch step (FIG. 5). Preferably, all openings would be fully plugged to optimize the results sought.

Figure 6:
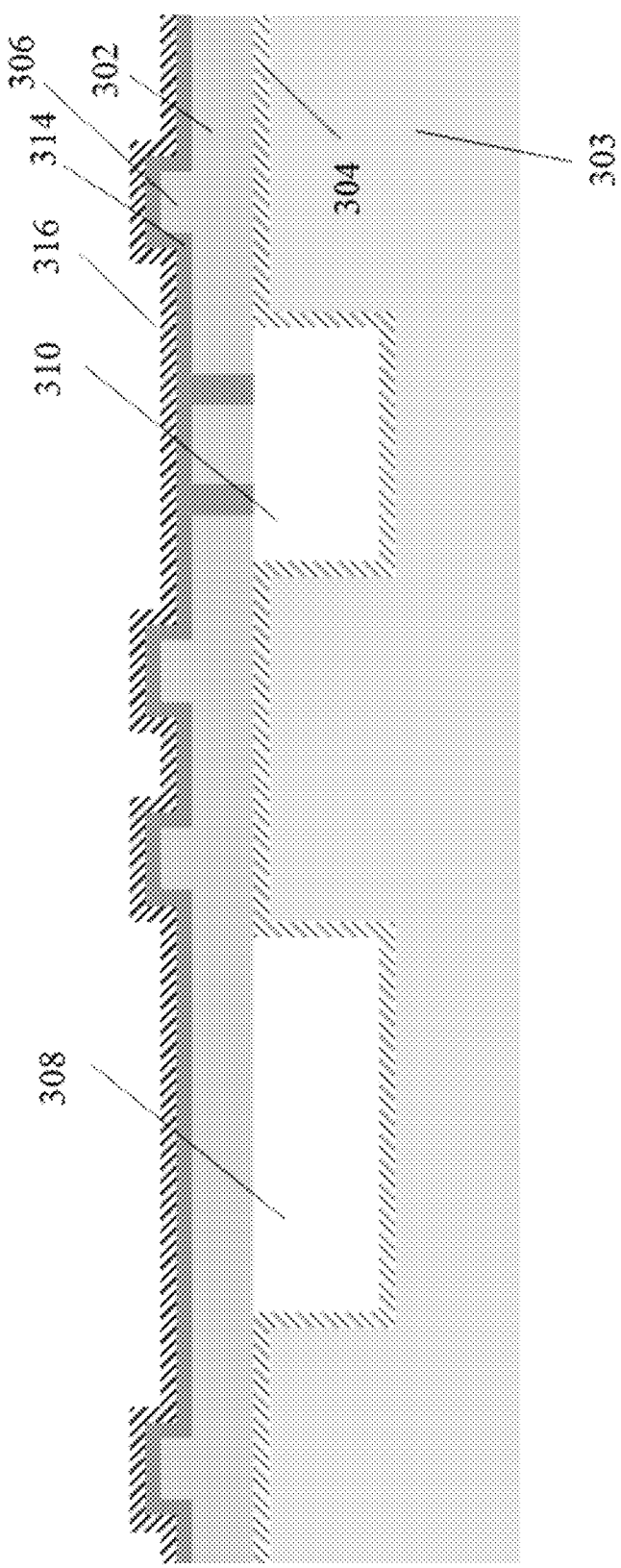
FIG. 6 illustrates a step of polysilicon deposition.
Figure 7:
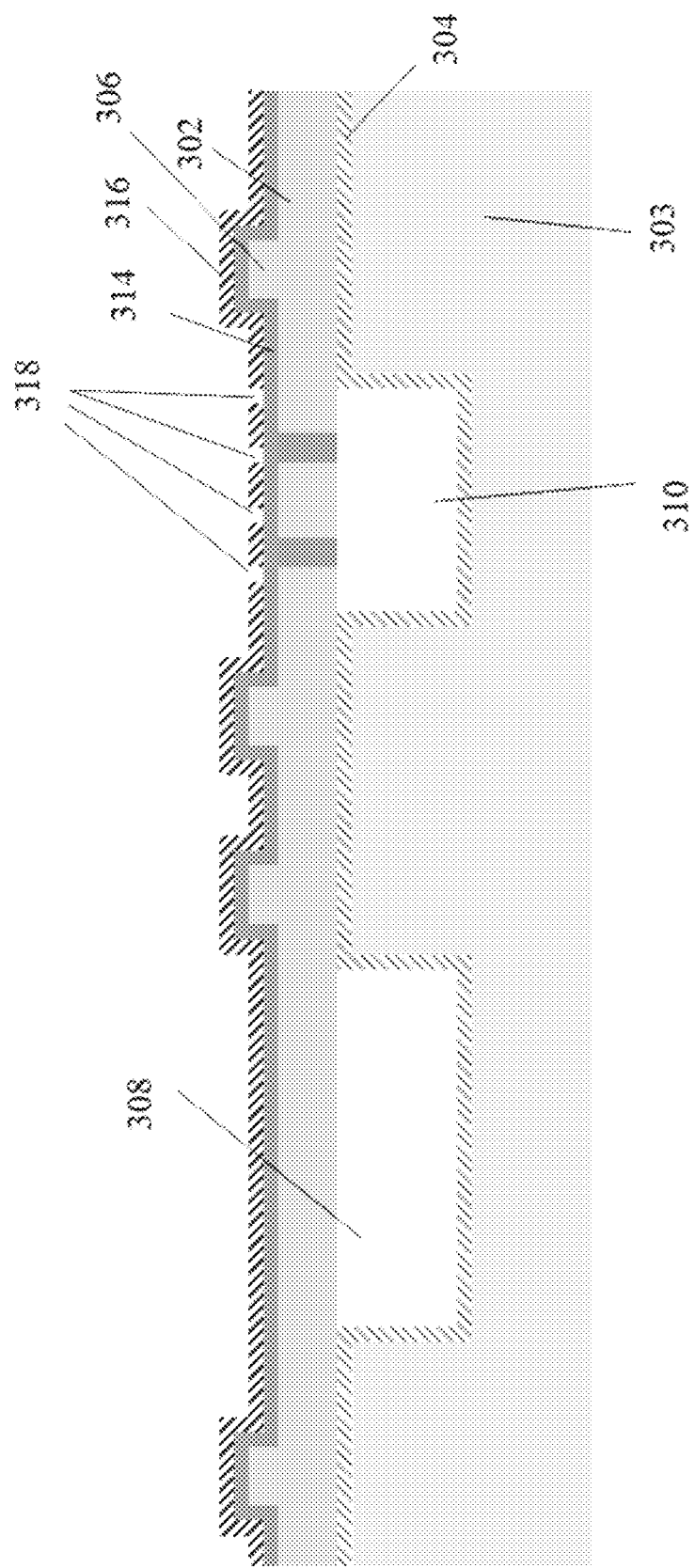
FIG. 7 illustrates a step for a polysilicon pattern and etch to define release holes.

Further from FIGS. 2 and 6, a first capping layer 316 is deposited on top of the sacrificial layer at 240. In one or more preferred embodiments, the sacrificial layer comprises an electrically conductive material (e.g., poly-crystalline silicon, epitaxial silicon, other similar semi-conductor(s), metal, etc.) or an electrically insulating layer (e.g. silicon nitride, aluminum oxide, aluminum nitride, silicon oxide, etc.). At 250, the first capping layer 316 is patterned and etched stopping on the underlying sacrificial layer 314 so as to create openings 318 over the enclosure to be sealed, with such openings being preferably sufficiently narrow so as to be sealable by a conformal or partially conformal deposition of the second capping layer 320 to be deposited in a following step (FIG. 7). Further, this step may optionally also provide for the creation of additional openings in the capping layer distal from the enclosure to be sealed in order to provide for, in combination with the following sacrificial layer etch, electrical contact vias between the device layer 302 and the second capping layer 320, to be deposited in a following step.

Figure 8:
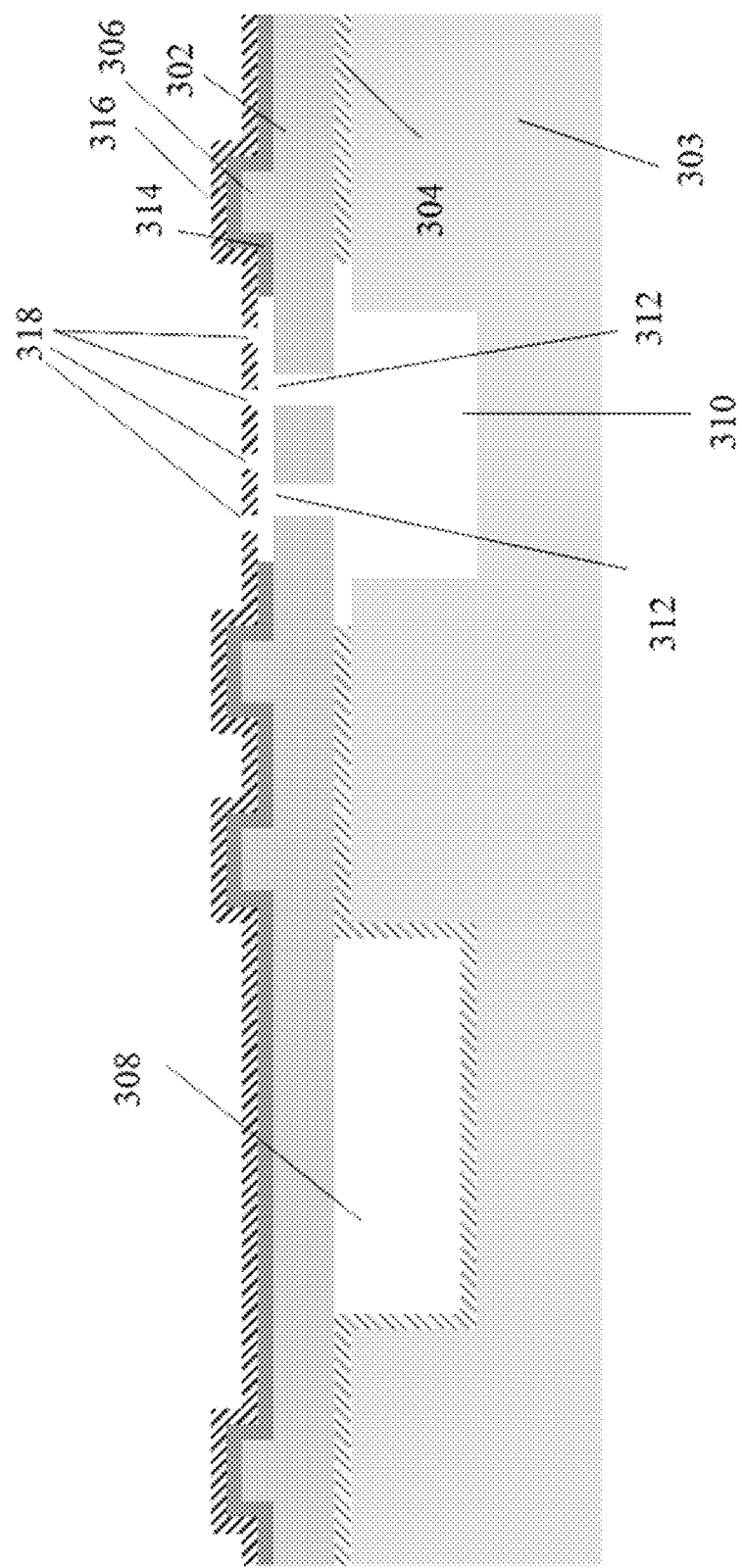
FIG. 8 illustrates a step for a selective oxide etch to release the structure while preserving the polysilicon cap.
Figure 9:
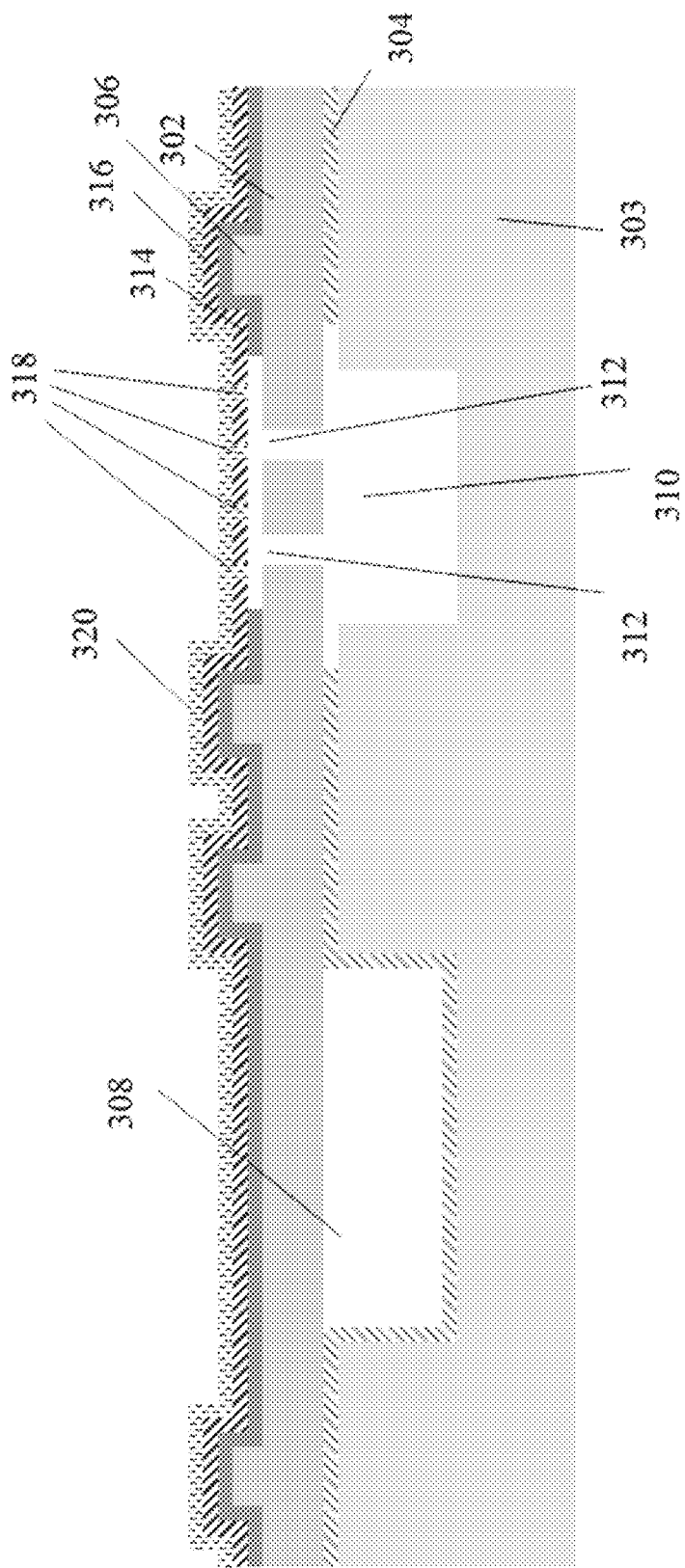
FIG. 9 illustrates a second polysilicon deposition step with a sufficient thickness to plug release holes in the polysilicon layer.

From FIG. 2 and FIG. 8, the wafer at 260 is then subjected to an isotropic etchant that selectively removes the sacrificial layer 314 while preserving the first capping layer 316 and the silicon device layer 302. From step 260, this etching process of a method and system in accordance with the present invention will effectively open the cavity between the first capping layer and the silicon device layer and will also remove the sacrificial layer over the contact vias as defined by the prior step. At 270, a second capping layer 320 is deposited to a predetermined and sufficient thickness to preferably seal the openings 318 in the first capping layer 316 over the enclosure, thereby creating a sealed enclosure 332 (FIG. 9). Preferably, in one or more embodiments, all openings would be fully plugged to optimize the results sought. The second capping layer 320 may also comprise an electrically conductive or electrically insulating material. Optionally, the deposition of this step may be performed in a low pressure environment to seal a low pressure inside the enclosure 332 or sealed in a preferred or desired ambient (i.e., gas) compatible with the deposition. In one embodiment, it is envisioned that a hydrogen rich ambient may be sealed in the enclosure with the hydrogen later diffused out of the enclosure by a high temperature vacuum bake. It will be recognized by those skilled in the art that the invention is not so limited to the exemplars herein but instead a method and system in accordance with the present invention may have many beneficial variations.

Figure 10:
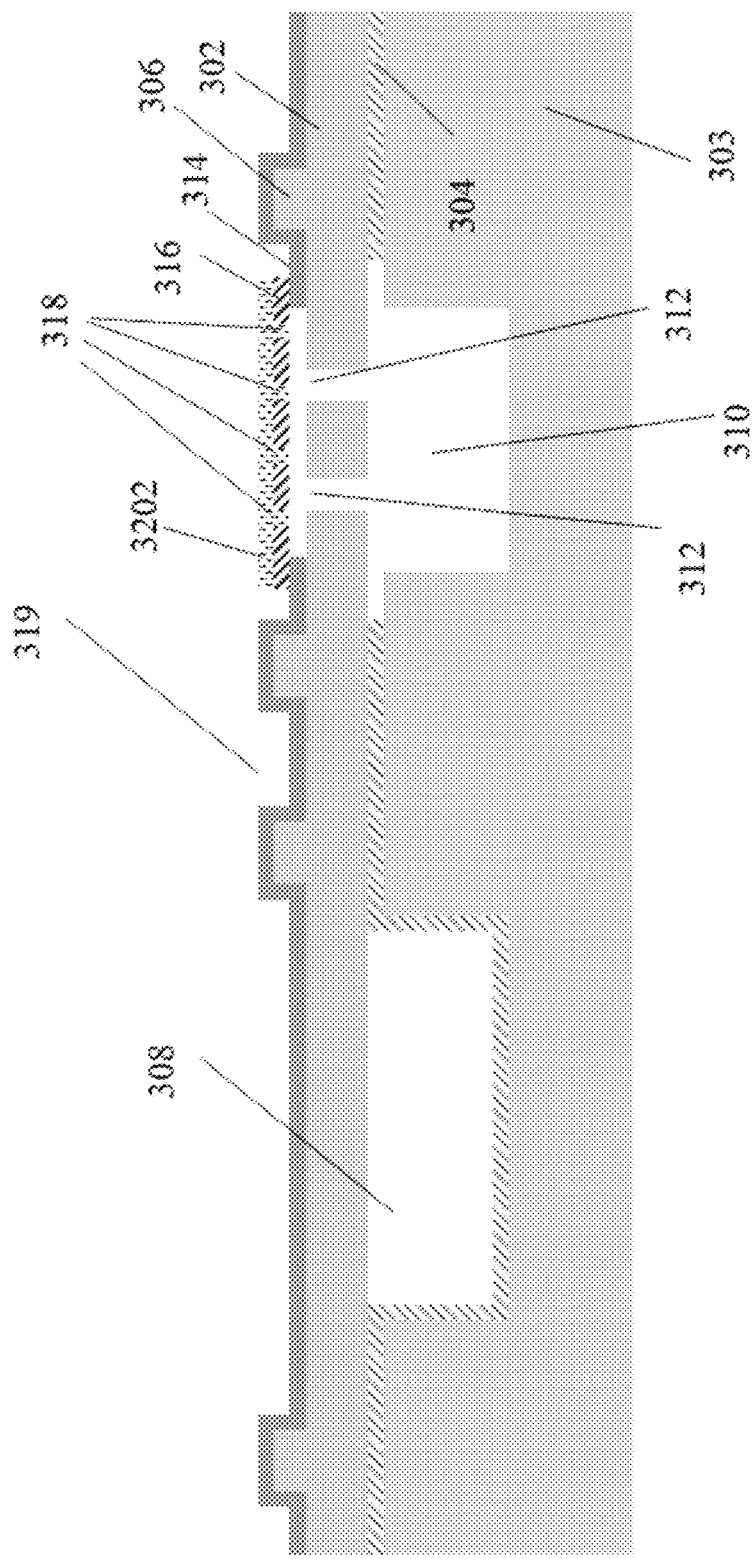
FIG. 10 illustrates polysilicon pattern and etch step, stopping the etch on the oxide layer.
Figure 11:
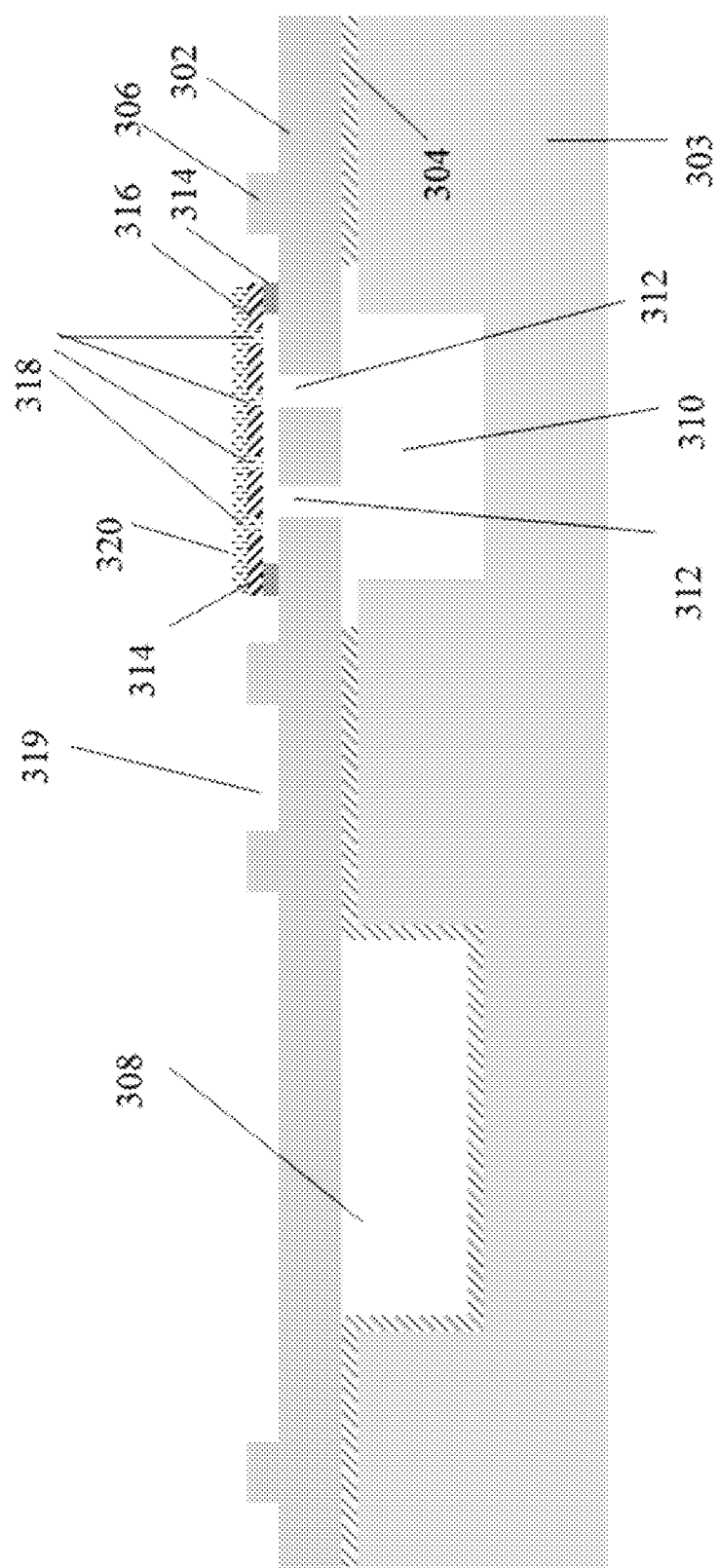
FIG. 11 illustrate an oxide etch step, stopping on device layer.
Figure 12:
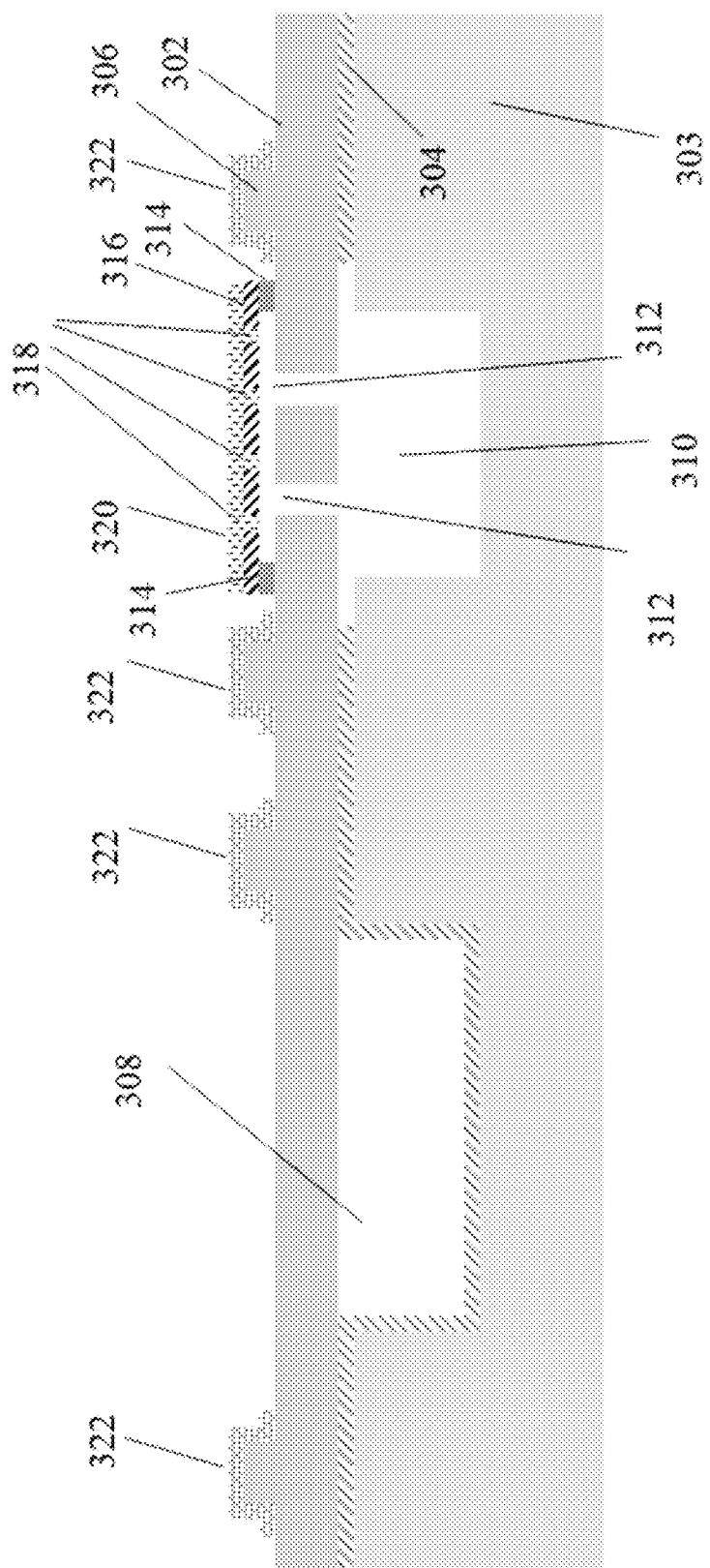
FIG. 12 illustrates a step providing for germanium deposition, pattern, and etch.
Figure 13:
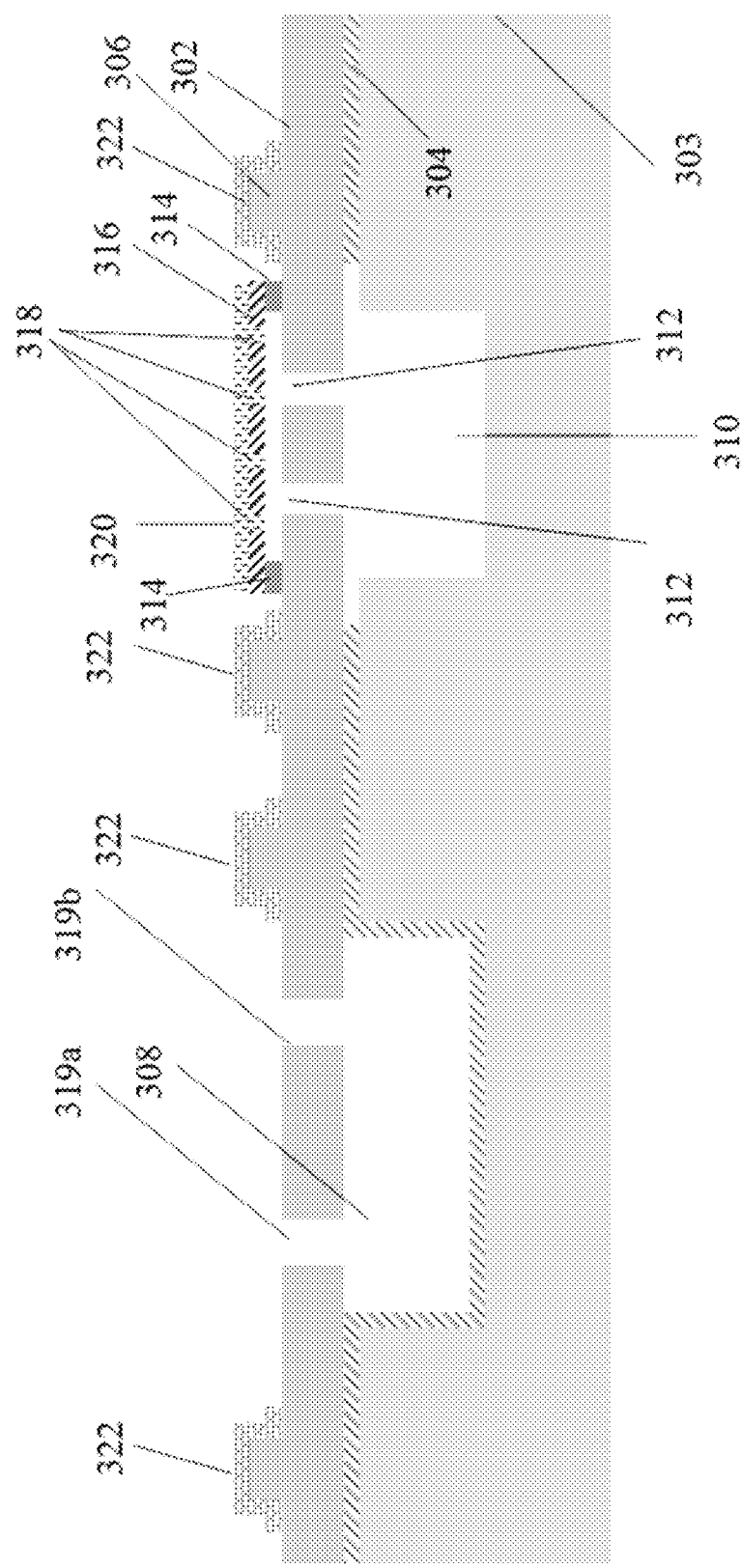
FIG. 13 illustrates a device layer pattern and etch.
Figure 14:
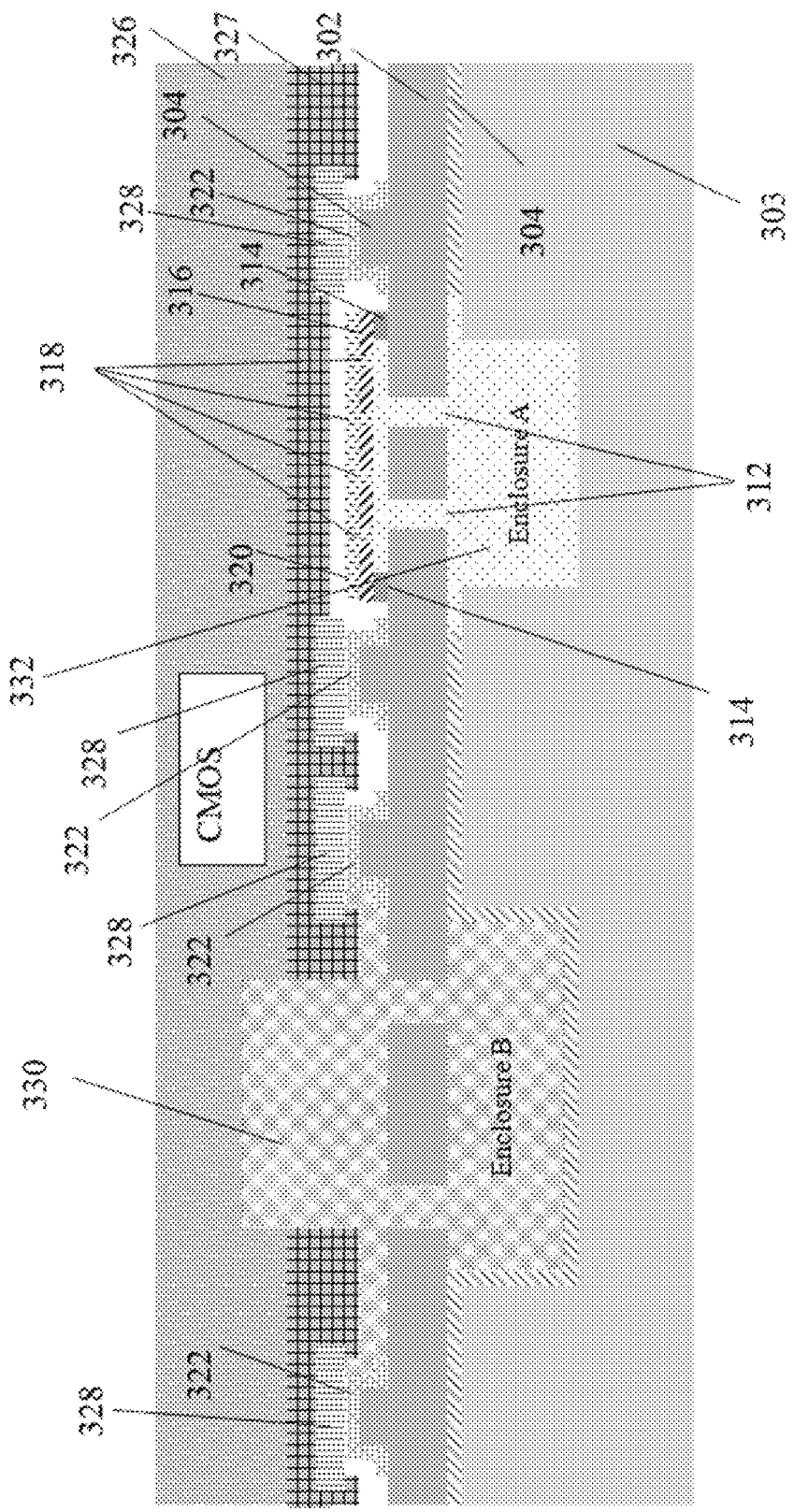
FIG. 14 illustrates a product of the process being a MEMS wafer bonded to a CMOS wafer, producing two separate enclosures (Enclosure A and Enclosure B).

From FIG. 2 and FIG. 10, at 275, both the first and second capping layers 316 and 320 are patterned and etched stopping on the underlying sacrificial layer 314. The sacrificial layer 314 is then removed at 280 using a wet or dry etch, stopping on the silicon device layer (FIG. 11). Once the sacrificial layer 314 is removed, the NF process is continued for the remaining standard operation (i.e., normally with Germanium (322) deposition, pattern and etch at 290; silicon device layer 302 pattern and etch in 295, followed by eutectic bonding to a CMOS wafer 326 in step 297) shown in FIG. 14. The result of the process is a MEMS device 299 having an integrated second sealed enclosure in addition to the main sealed enclosure. In an embodiment, the second sealed enclosure may reside inside or outside of the main sealed enclosure.

B. Multiple Ambient Cavities Created During Wafer Bonding

FIGS. 15-27 set forth a process, in various methods, for integrating a second sealed enclosure in addition to the main sealed enclosure, in accordance with one or more embodiments, whereby the process creates two or more enclosures with different pressures or ambients during the wafer bonding process, which allows for multiple pressure and/or gas composition on a single device using a single bond step.

Figure 15:
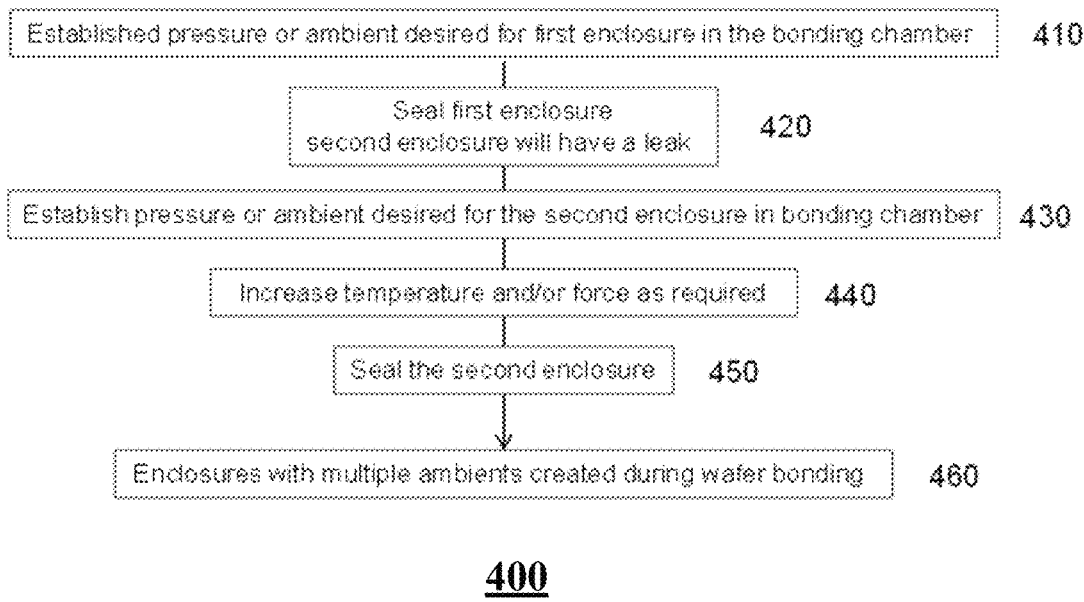
FIG. 15 sets forth a process for creating a device with two sealed enclosures with different pressures and/or gas compositions, in accordance with one or more embodiments.
Figure 16:
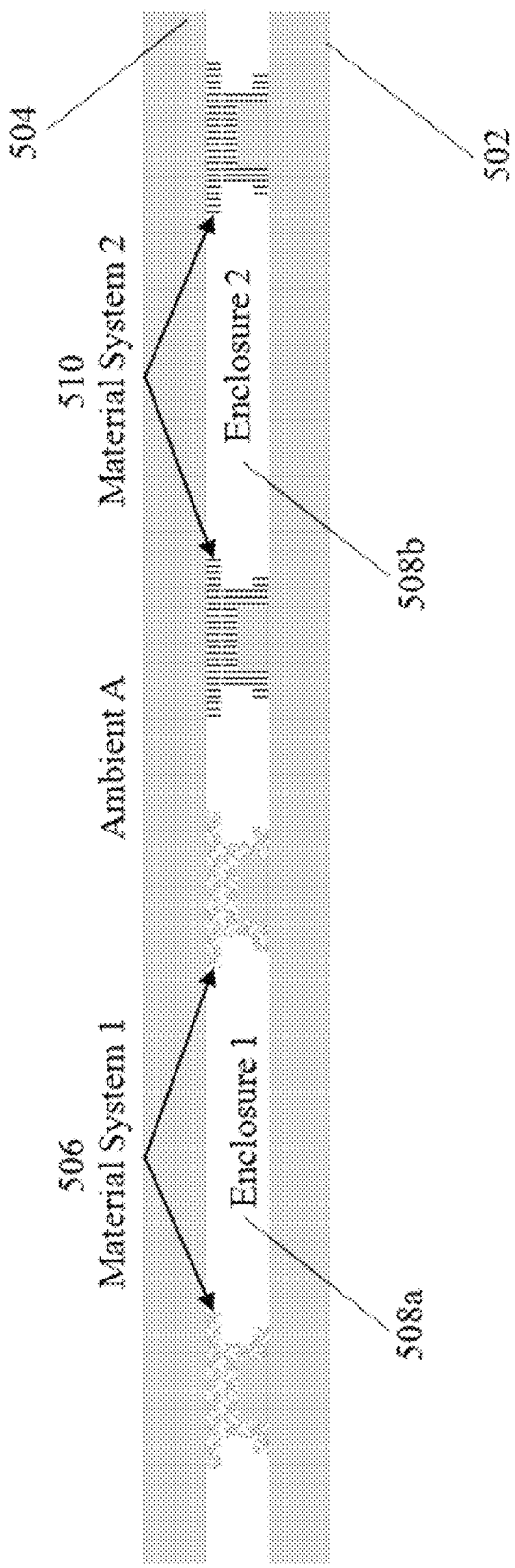
FIG. 16 illustrates a device with two enclosures, defined by seal-rings, where seal-ring of one enclosure is composed of a different material systems than that of the second enclosure, and where ambient A is established in the bond chamber.
Figure 17:
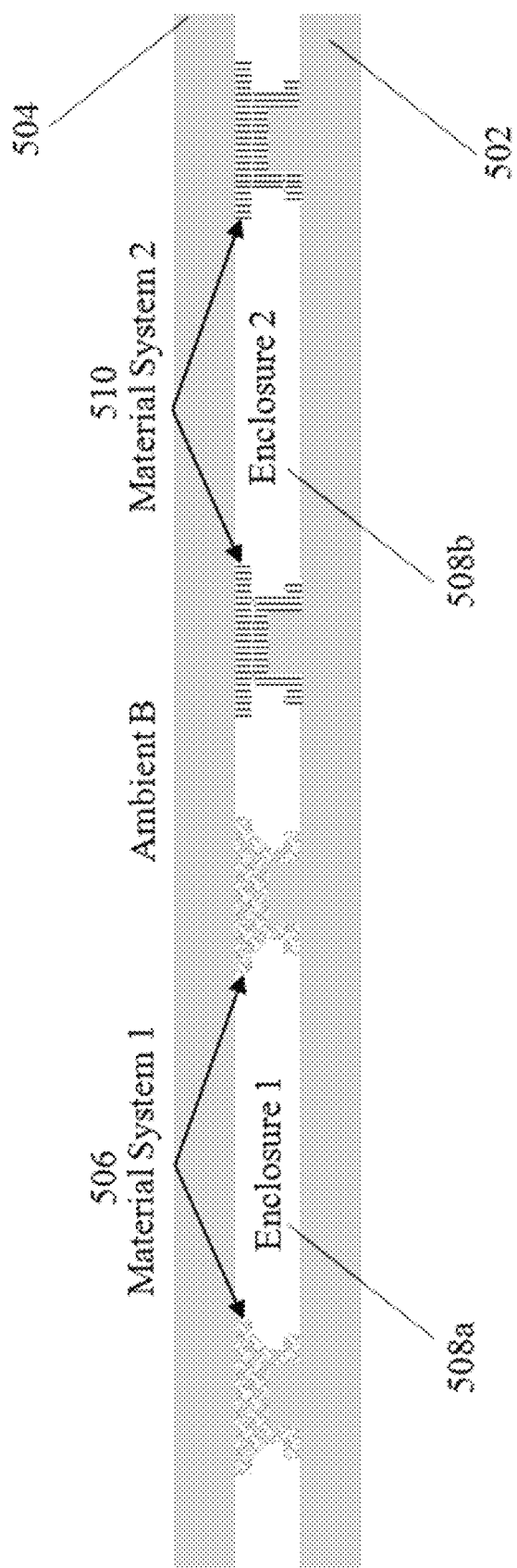
FIG. 17 illustrates that the temperature is raised to a level sufficient to reflow Material System 1 but not Material System 2, sealing Enclosure 1 with ambient A, where ambient B is then established in Enclosure 2.
Figure 18:
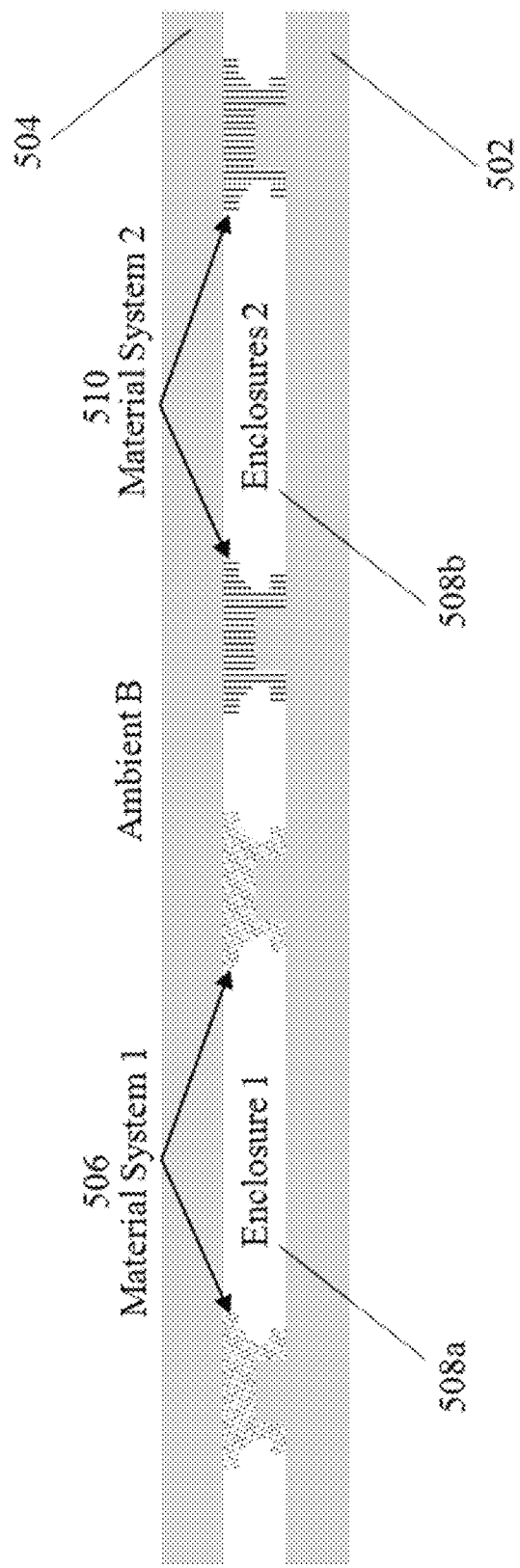
FIG. 18 illustrates that the temperature is raised further to a level sufficient to reflow Material System 2, sealing Enclosure 2 with ambient B.
Figure 19:
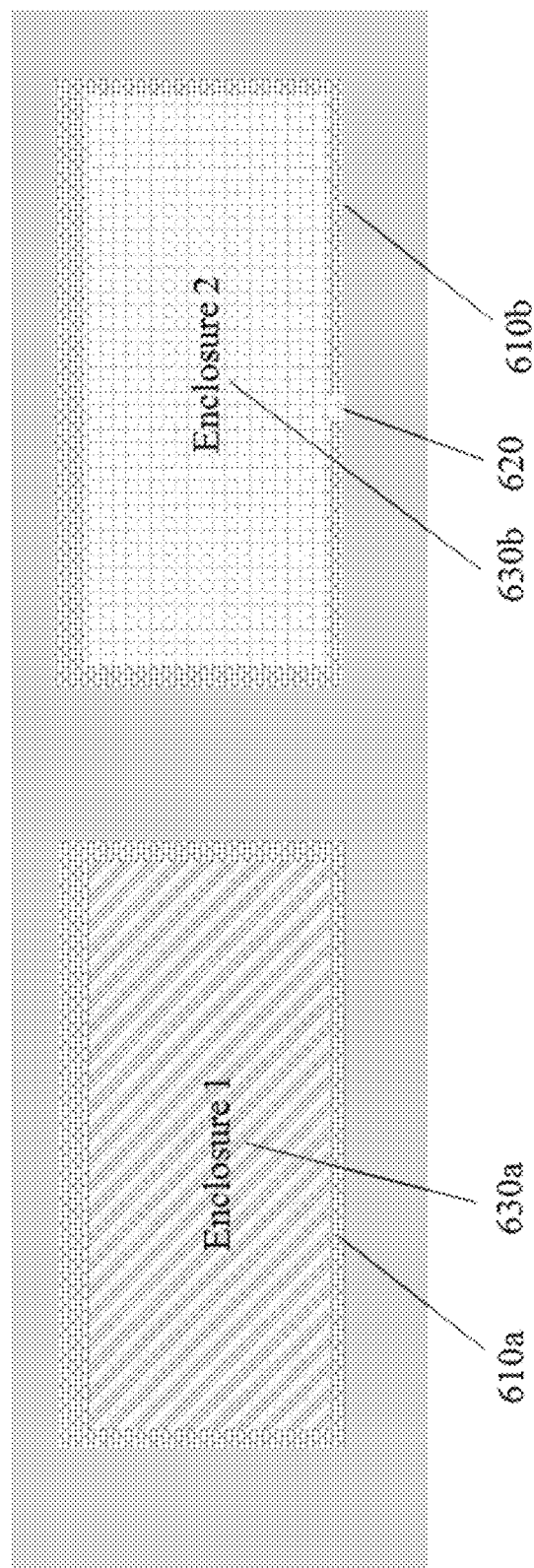
FIG. 19 illustrates a top view, in which there are two enclosures defined by seal-rings, one having a gap in the seal-ring that will be sealed by controlled solder flow.
Figure 20:
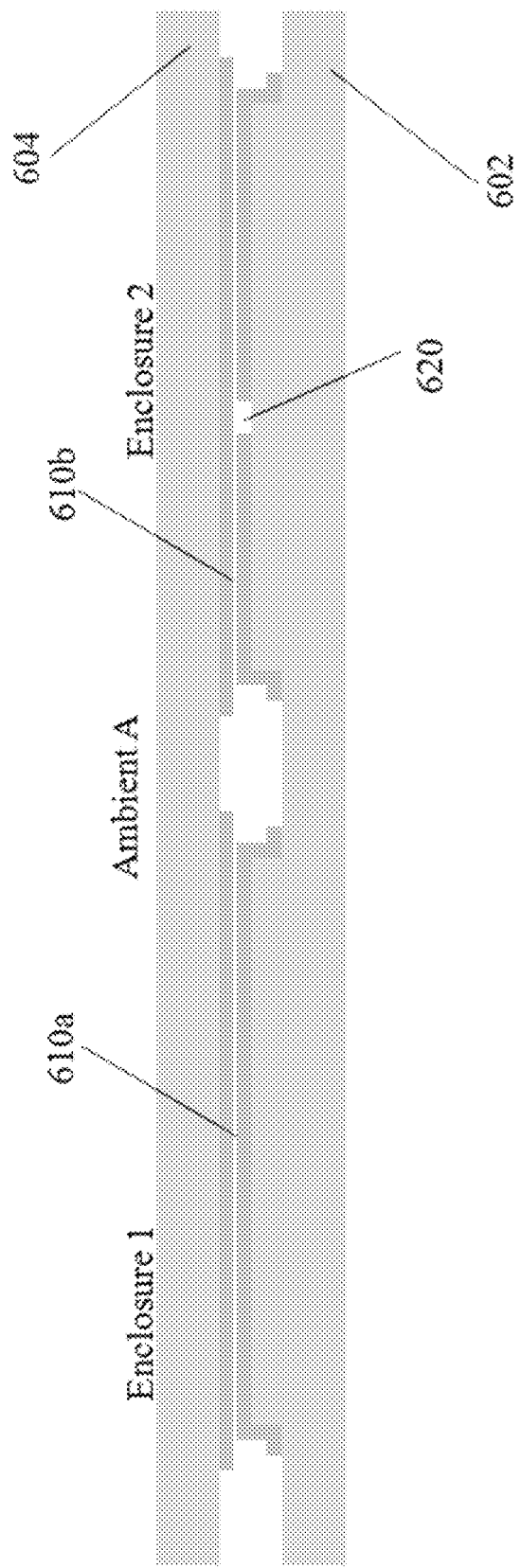
FIG. 20 illustrates a cross-sectional view, in which there are two enclosures; one has a gap in the seal-ring that will be sealed by controlled solder flow, and where initially, ambient A is established in the bond chamber.
Figure 21:
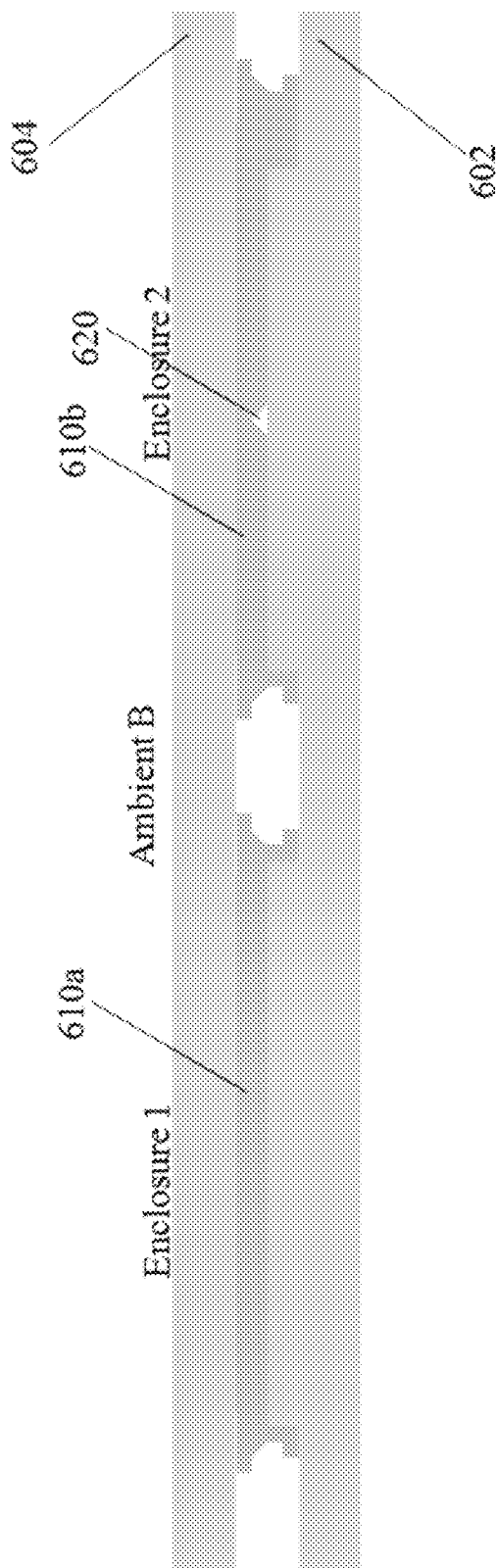
FIG. 21 illustrates that ambient A is established in the bond chamber and the temperature is raised to reflow the solder, sealing ambient A in Enclosure 1, where ambient B is then established in the bond chamber.
Figure 22:
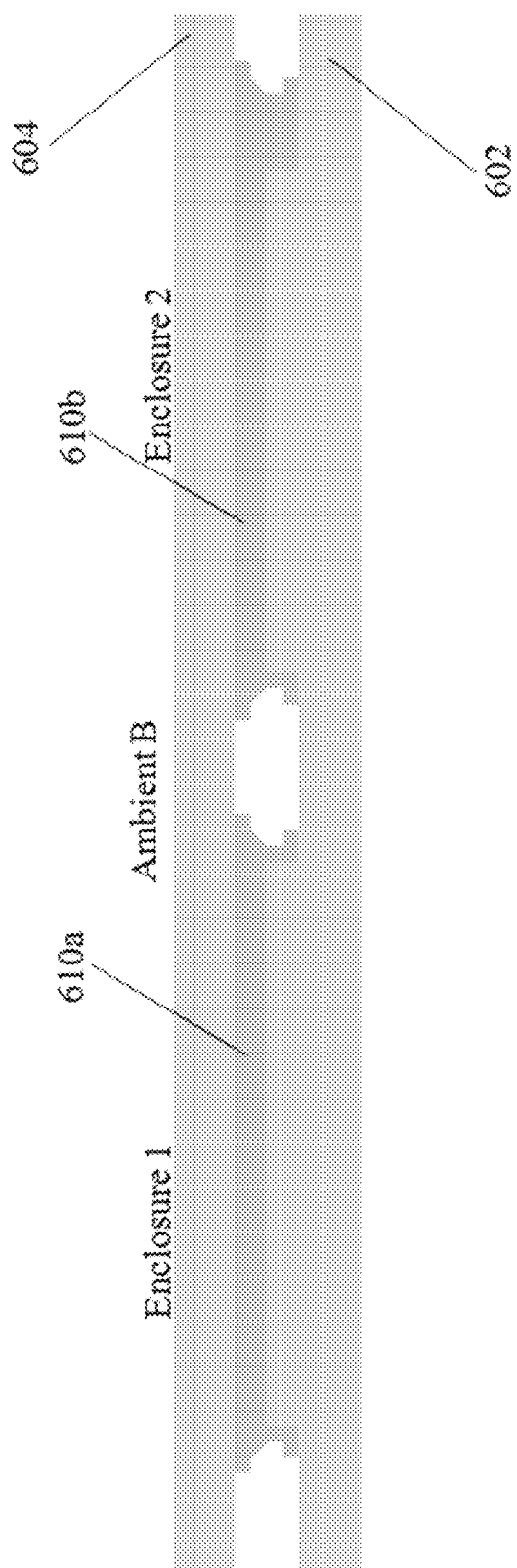
FIG. 22 illustrates ambient B established in the bond chamber and the temperature and/or force on the substrate stack is raised to increase solder flow so as to seal the gap in the seal-ring on Enclosure 2, sealing ambient B in Enclosure 2.

FIG. 15 sets forth a process 400 for integrating two sealed enclosures with different gas compositions and/or pressures, in accordance with one or more embodiments. From FIG. 15, a method is provided to create two or more cavities with different pressures or ambients during the wafer bonding process, which allows for multiple pressure and/or gas composition through the single bond step. From FIG. 15, multiple methods may be further adapted in one or more embodiments to benefit from the process of a method and system in accordance with the present invention. Various embodiments may include a variety of options and approaches, such as but not limited to: multiple material systems; controlled solder flow; outgassing/gettering; and, multiple height seal rings, for instance.

B1—Multiple Material Systems

FIGS. 15-18, for example, may refer to an approach involving multiple material systems. In such an approach, for example, seal-rings defining different enclosures use different material systems, where the different material systems have different bonding temperatures. Different material systems may differ in their composition, doping, grain structure, or surface topology. For example, for a solder bond, different material systems would have different reflow temperatures. Similarly, for a glass frit system, different frit compositions would be used for the different cavities, each composition having a different reflow temperature. By way of further example, for a chip with two cavities using a solder seal, the bonding cycle in such a system would consist of two temperature stages.

From FIGS. 15-18, two wafers (502, 504) are brought together in a bond chamber and first pressure or ambient desired for the first device (Ambient A) is established in the bonding chamber and the wafers are first raised to a temperature sufficient to reflow the solder of the first material system 506 but not that of the second material system 510 thereby sealing the first device enclosure 508a while keeping the second device enclosure 508b unsealed, at 410. From step 410, the second cavity 508b may likely leak to the bond chamber ambient or pressure by virtue of the surface roughness of the seal-ring surface between the two wafers, at 420. Thereafter, at 430, pressure or ambient desired for the second device (Ambient B) is then established in the bonding chamber and the wafer temperature is raised further at 440 so as to reflow the solder of the second material system 510 thereby sealing the second device enclosure 508b at 450, whereby multiple cavities with multiple gas compositions and/or pressures are created during wafer bonding at 460, in accordance with a method and system in accordance with the present invention.

B2—Controlled Solder Flow

FIGS. 19-22, for example, may refer to an approach involving controlled solder flow. In this approach, the two or more enclosures use solder seal-rings 610a, 610b with identical material systems. Operatively, however, some enclosures may have a small gap 620 in the seal-ring solder. Therefore, as the wafer temperature is raised, the seal-ring 610a without a gap will typically seal first, then as the temperature is raised further or additional force is applied, or simply due to additional time, solder flow across the gaps will seal the enclosures with seal-rings 610b containing gaps 620. Therefore, for a method and system in accordance with the present invention, by controlling the bond chamber pressure or ambient between the two sealing events, the pressure or ambient of the different devices can be independently controlled.

By way of example, adapting the approach of FIG. 15, for a chip with two enclosures, the first enclosure 630a will contain a full seal-ring 610a, while the second enclosure 630b will contain seal-ring 610b with a small gap 620. First a pressure or ambient required for the first enclosure 630a (Ambient A) is established in the bond chamber and the wafer temperature is raised to a level sufficient to reflow the solder only at the interface between the two wafers but induce only minimum solder flow. A pressure or ambient required by the second enclosure 630b (Ambient B) thereafter is established in the bond chamber and the wafer temperature is raised further to increase the amount of reacted solder, producing sufficient solder volume and flow to cross the gap 620 in the seal-ring of the second enclosure 630b thereby sealing the second enclosure.

B3—Outgassing/Gettering

Figure 23:
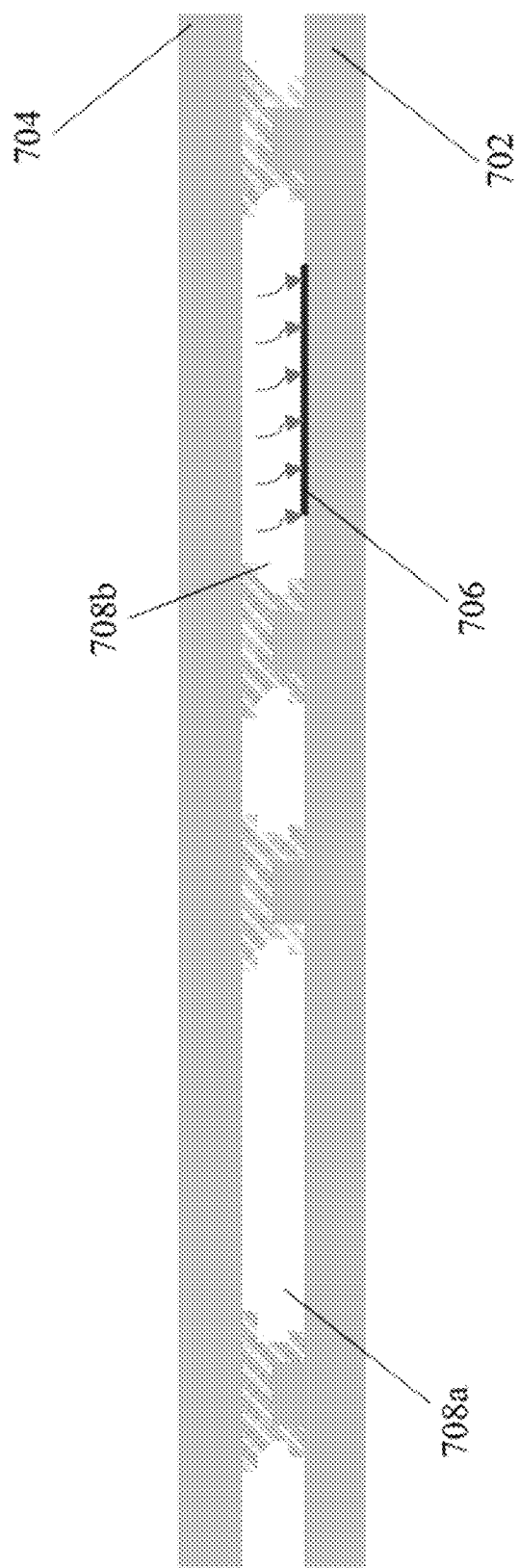
FIG. 23 illustrates that a single pressure is established in the bond chamber during reflow of seal-rings of both Enclosure 1 and Enclosure 2; Enclosure 2 contains a gettering element that at elevated temperature absorbs at least one of the gasses present in the enclosure to decrease enclosure pressure.
Figure 24:
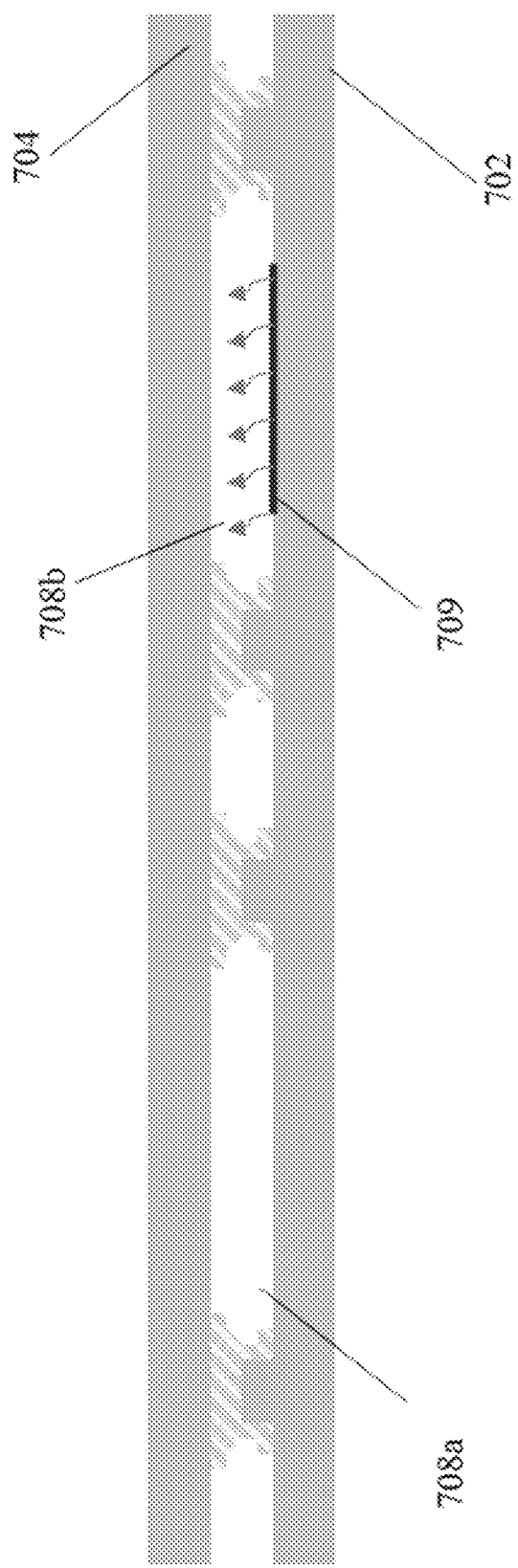
FIG. 24 illustrates that a single pressure is established in the bond chamber during reflow of seal-rings of both Enclosure 1 and Enclosure 2, while Enclosure 2 controls an outgassing source that, at elevated temperature, desorbs a controlled amount of one or more gases thereby increasing the enclosure pressure.

FIGS. 23-24, for example, may refer to an approach involving outgassing/gettering. It can be understood that the exemplary aspects depicted in FIGS. 23-24 are shown in simplified form, without other details depicted, for example, regarding FIGS. 3-14, for the purposes of illustration of sealed enclosures having different cavity pressures as a result of inclusion of a gettering or an outgassing substance in one or more of the sealed enclosures with a MEMS structure, and not limitation. As such, it can be further understood one or more of the sealed enclosures depicted in FIGS. 23-24 can comprise a MEMS structure such as MEMS resonators, MEMS sensors, MEMS inertial sensors, and/or other MEMS structures, and so on, as available to one skilled in the art. In this approach, a substance that either outgases or absorbs (getters) gas at high temperature is included in one or more of the enclosures. The two wafers 702, 704 are then sealed using any valid high-temperature approach including solder reflow, glass frit, anodic bonding, or epoxy bonding. At the elevated temperature the included substance will either outgas, thereby creating a higher pressure in its enclosure, or serve as a getter thereby creating a lower pressure in its enclosure. Thus, as further described above, it can be understood that, after sealing, the environment of a sealed enclosure for an exemplary MEMS device can have a higher cavity pressure (where a material is included in the sealed enclosure that can desorb (outgas) gas molecules) as a result of desorption of gas molecules than another of the sealed enclosures that does not include an out-gassing substance. It can be further understood that, after sealing, the environment of the sealed enclosure for an exemplary MEMS device can have a lower cavity pressure (where a material is included in the sealed enclosure that can absorb (getter) gas molecules) as a result of absorption of gas molecules than another of the sealed enclosures that does not include a gettering substance.

FIG. 23 illustrates that a single pressure is established in the bond chamber during reflow of seal-rings of both enclosure 708a and enclosure 708b, enclosure 708b contains a gettering element 706 that, at elevated temperature, absorbs at least one of the gasses present in the enclosure to decrease enclosure pressure.

FIG. 24 illustrates that a single pressure is established in the bond chamber during reflow of seal-rings of both enclosure 708a and enclosure 708b, while enclosure 2 708b contains an outgassing source 709 that, at elevated temperature, desorbs a controlled amount of one or more gases thereby increasing the enclosure pressure.

B4—Multiple Height Seal-Rings

Figure 25:
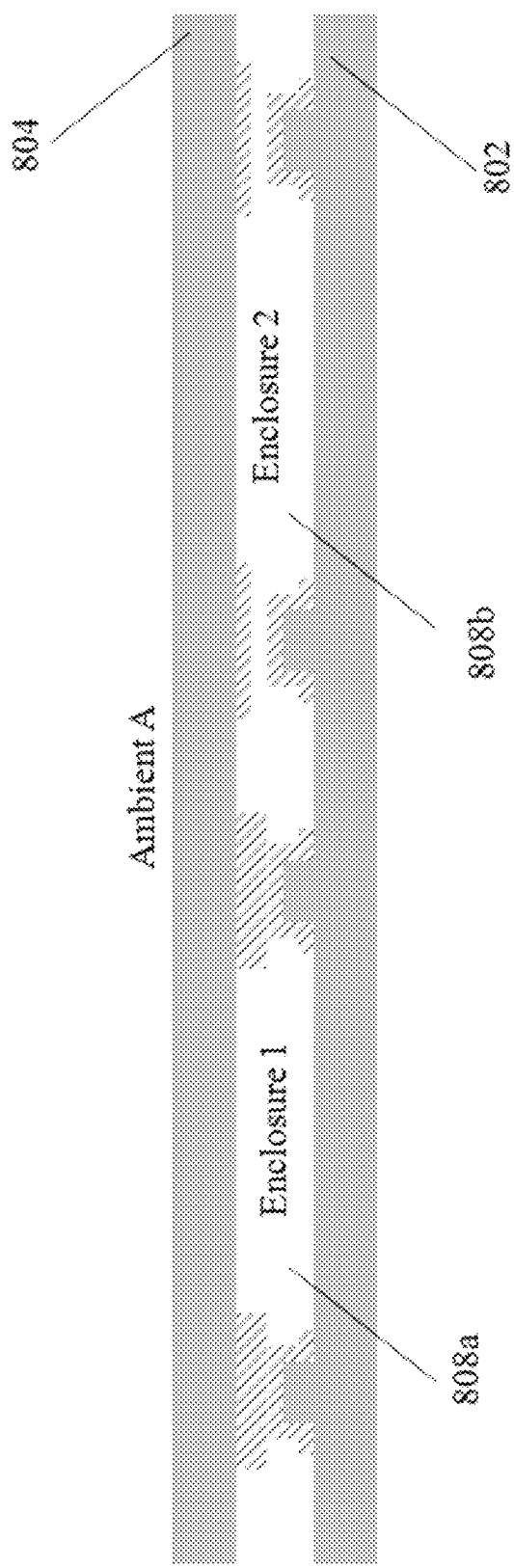
FIG. 25 illustrates two cavities having a different seal-ring solder height; initially ambient A is established in the bond chamber.
Figure 26:
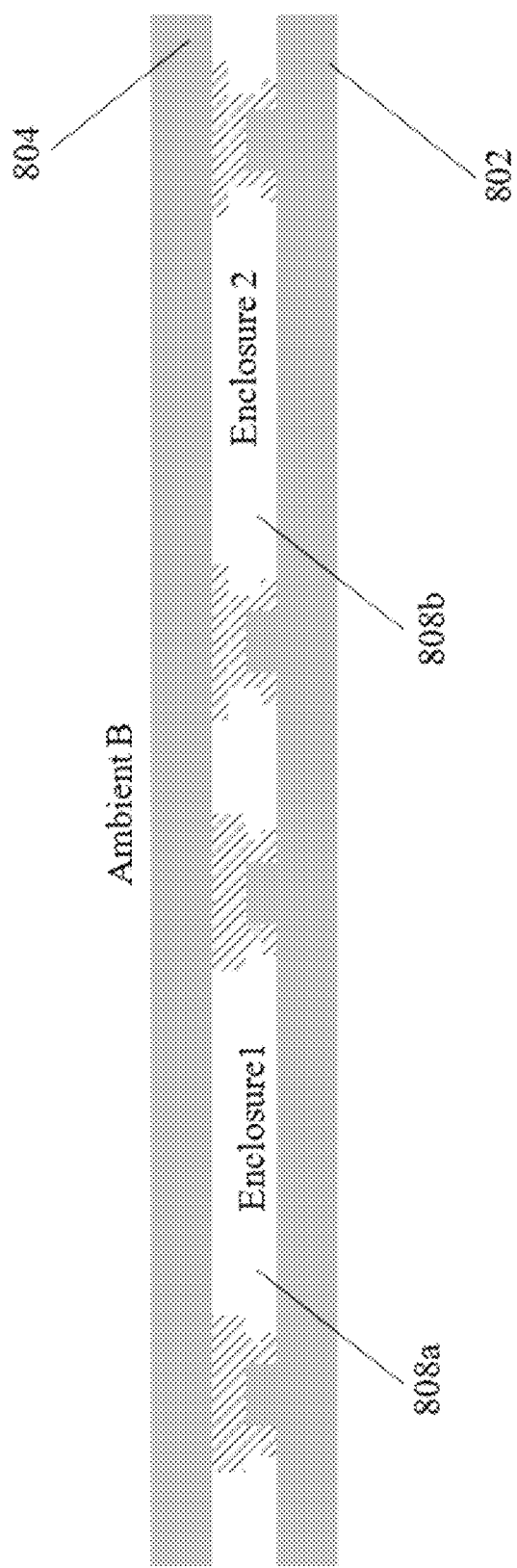
FIG. 26 illustrates that ambient A is established and temperature is raised to reflow the solder; the solder on Enclosure 1 seal-ring melts and flows, sealing Enclosure 1 with ambient A and also reducing the gap in the Enclosure 2 seal-ring, and ambient B is then established in the bond chamber.
Figure 27:
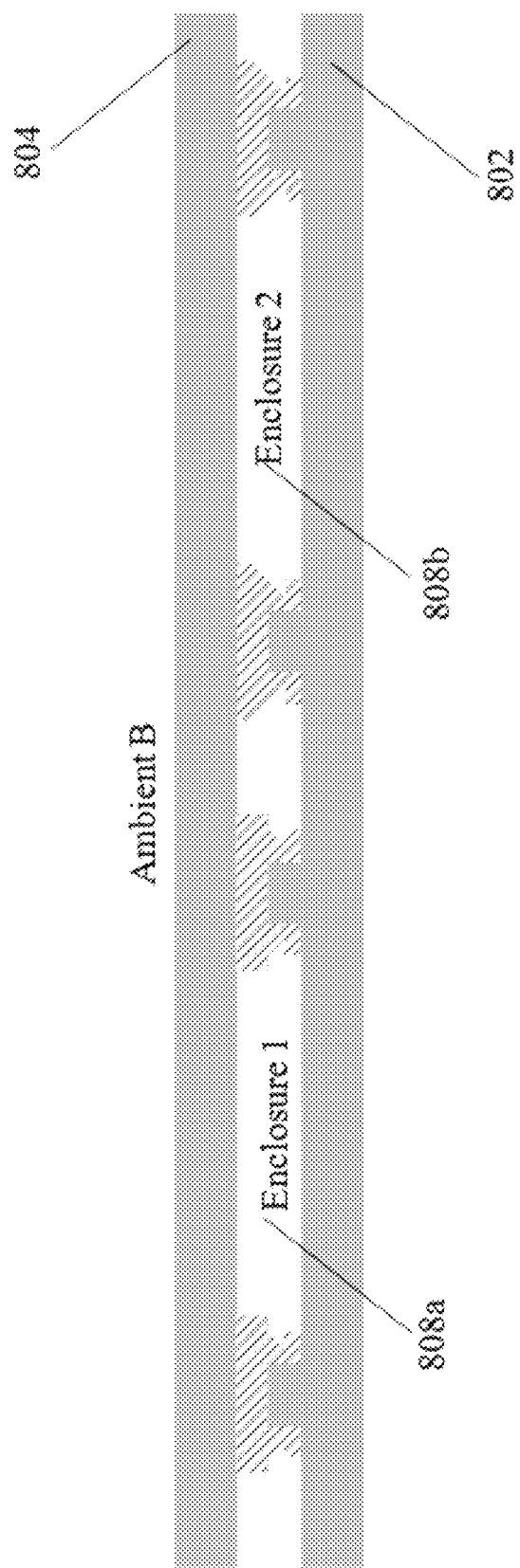
FIG. 27 illustrates ambient B is established prior to Enclosure 2 seal-ring solder coming into contact; while the two solder surfaces on Enclosure 2 seal-ring are brought into contact, the solder re-flows sealing Enclosure 2 with ambient B.

FIGS. 25-27, for example, may refer to an approach involving multiple height seal rings. In this approach, seal-ring solder materials for the two or more enclosures are of different heights such that, when wafers 802 and 804 are brought together in the bond chamber 810, only the tallest seal-ring will initially be in physical contact. A first gas pressure and composition (Ambient A) is established in the bond chamber, and then a force is applied pushing the two wafers together. When the wafer temperature is raised sufficiently high to reflow the solder, the first enclosure 808a will be sealed at Ambient A and at the same time the solder, now in a liquid state, will be partially squeezed out by the applied force, thereby bringing the next tallest seal-ring into contact and sealing the second enclosure 808b. If the bond chamber pressure and composition is changed (Ambient 2) between the two sealing events, the gas pressure and/or composition of each enclosure can be controlled independently. Optionally, the solder used may be a two component solder, with one component disposed on the bottom wafer and the other component on the top wafer, such that reflow at a particular temperature only occurs if the two components are in contact.

Approach C: Internal Gas Reservoir

FIGS. 28-33 set forth a process flow chart for integrating a secondary sealed enclosure (reservoir under a pressure in Ambient I) in addition to a main sealed enclosure (under another pressure in Ambient II), in accordance with one or more embodiments, whereby the process exposes one main enclosure open to the associated reservoir cavity after wafer bonding. The final enclosed pressures in Device A or B depend on both pressures of Ambient I and II. In effect, the Internal Gas Reservoir process method achieves well controlled multiple pressures and/or gas compositions. In a preferred embodiment a CMOS-MEMS wafer comprises a standard CMOS wafer with an aluminum top metallization layer eutecticly bonded to a MEMS wafer.

Figure 28:
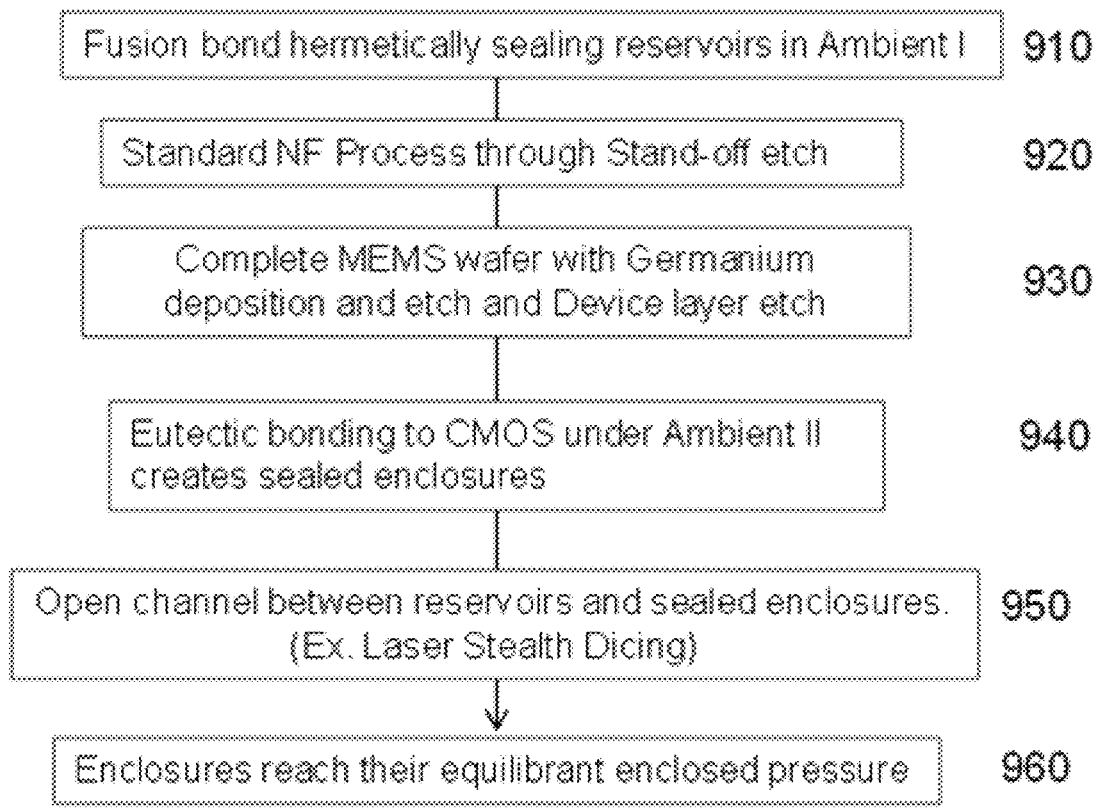
FIG. 28 sets forth a process flow chart for integrating a secondary sealed cavity (reservoir under a pressure in Ambient I) inside a main sealed enclosure (under another pressure in Ambient II), in accordance with one or more embodiments, whereby the process exposes one main enclosure open to the associated reservoir cavity after wafer bonding. The final enclosed pressures in Device A or B depend on both pressures of Ambient I and II.
Figure 29:
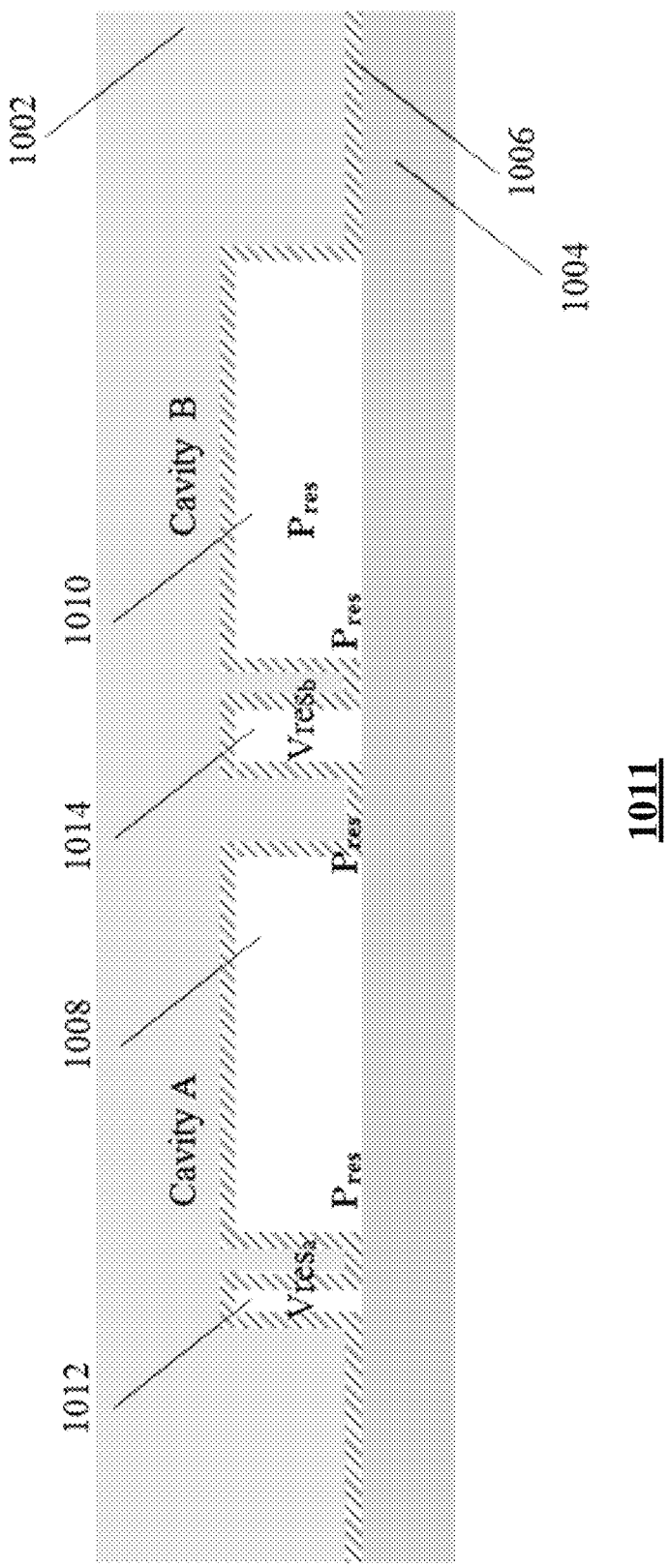
FIG. 29 illustrates a cross-section of Nasiri-Fabricated Engineered SOI (ESOI) wafer with two separate devices within a die targeting different final enclosure pressures and two sealed reservoirs. Handle wafer and device wafer were bonded by fusion bonding in ambient I under bond pressure $P_{res}$ (reservoir pressure).
Figure 30:
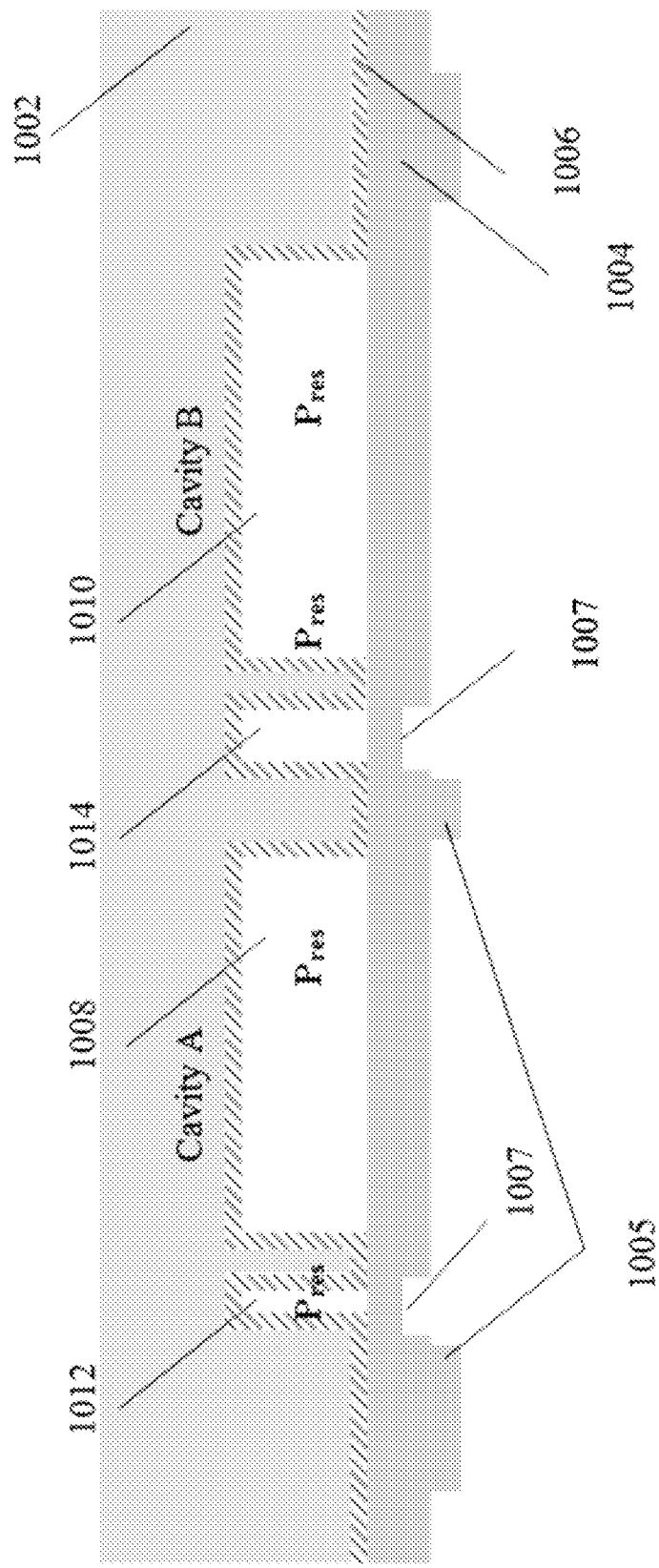
FIG. 30 illustrates a cross-section of a MEMS wafer processed through stand-off formation with optional thinning of the device layer under the reservoirs.
Figure 31:
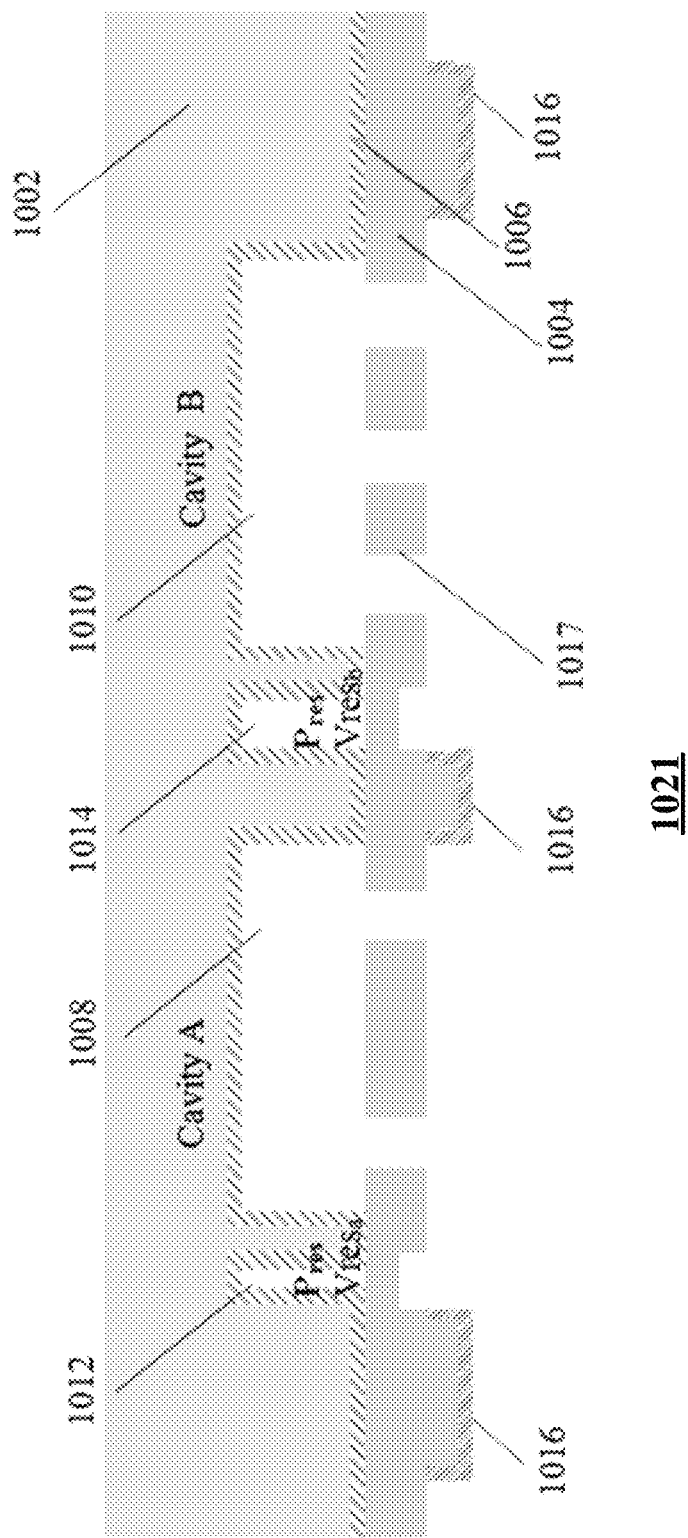
FIG. 31 illustrates the cross-section of a complete MEMS wafer with Ge deposition/pattern/etch and MEMS device layer pattern/etch.

FIG. 28 sets forth a process 900 for the Internal Gas reservoir method. From FIGS. 28 and 29, a silicon handle wafer 1002 with etched reservoirs 1008, 1010 and main cavities 1008, 1010 and a device wafer 1004 are bonded and sealed hermetically during wafer fusion bonding at 910 providing an Engineered SOI (ESOI) wafer 1011. From FIGS. 28 and 30, the MEMS wafer is further processed through stand-off 1005 formation in 920. Optionally, during this step, the device layer under the reservoirs 1012 and 1014 may be thinned, providing membranes 1007, to simplify breaching the reservoirs in the following steps. In one or more preferred embodiments, all cavities 1008, 1010 and gas reservoirs 1012, 1014 in the ESOI wafer have the same reservoir pressure $P_{res}$ which was set during fusion bonding of handle and device wafers, in Ambient I. Then from FIGS. 28 and 31, the MEMS wafer is further processed through germanium 1016 deposition, pattern, and etch, and device wafer 1004 pattern and etch in 930, providing a completed MEMS wafer 1021. At this stage, the cavities 1008 and 1010 are opened to the external environment. From FIGS. 28 and 32, the MEMS wafer 1021 is eutecticly bonded to a CMOS wafer 1020 under bonding pressure $P_{bond}$ in Ambient II at 940, forming sealed device enclosures 1052 and 1054. From FIGS. 28 and 33, the silicon membranes between the internal gas reservoirs 1012, 1014 and the associated device enclosures are opened at 950. The silicon membranes may be opened at either location 1050 or 1051 using Laser Stealth Dicing (LSD), externally applied mechanical stress, or another valid method. At 960, a CMOS-MEMS wafer with MEMS device enclosures A and B of different final equilibrant pressures is provided. Preferably, final equilibrium pressures of enclosures for device A and B will be $P_A$ and $P_B$, respectively, determined by $P_{res}$, $P_{bond}$ and volumes $V_{res}$ and $V_{cav}$ of corresponding internal gas reservoirs and devices. In an embodiment, the Laser Stealth Dicing (LSD) technique is used to Laser cut (or break) the thin isolation silicon membranes between the respective internal gas reservoir and main MEMS device enclosures within the die. The membranes could be parallel or normal to the CMOS wafer surface by design. After the silicon membranes breakage by LSD, the final equilibrium pressure $P_i$ of each of the MEMS device (i=A, B, C, . . . ) with main enclosure volume $Vcav_i$ (i=A, B, C, . . . ) and corresponding gas reservoir volume $Vres_i$ (i=A, B, C, . . . ) in a die will depend upon parameters including P, V, and λ according to the gas law.

Figure 32:
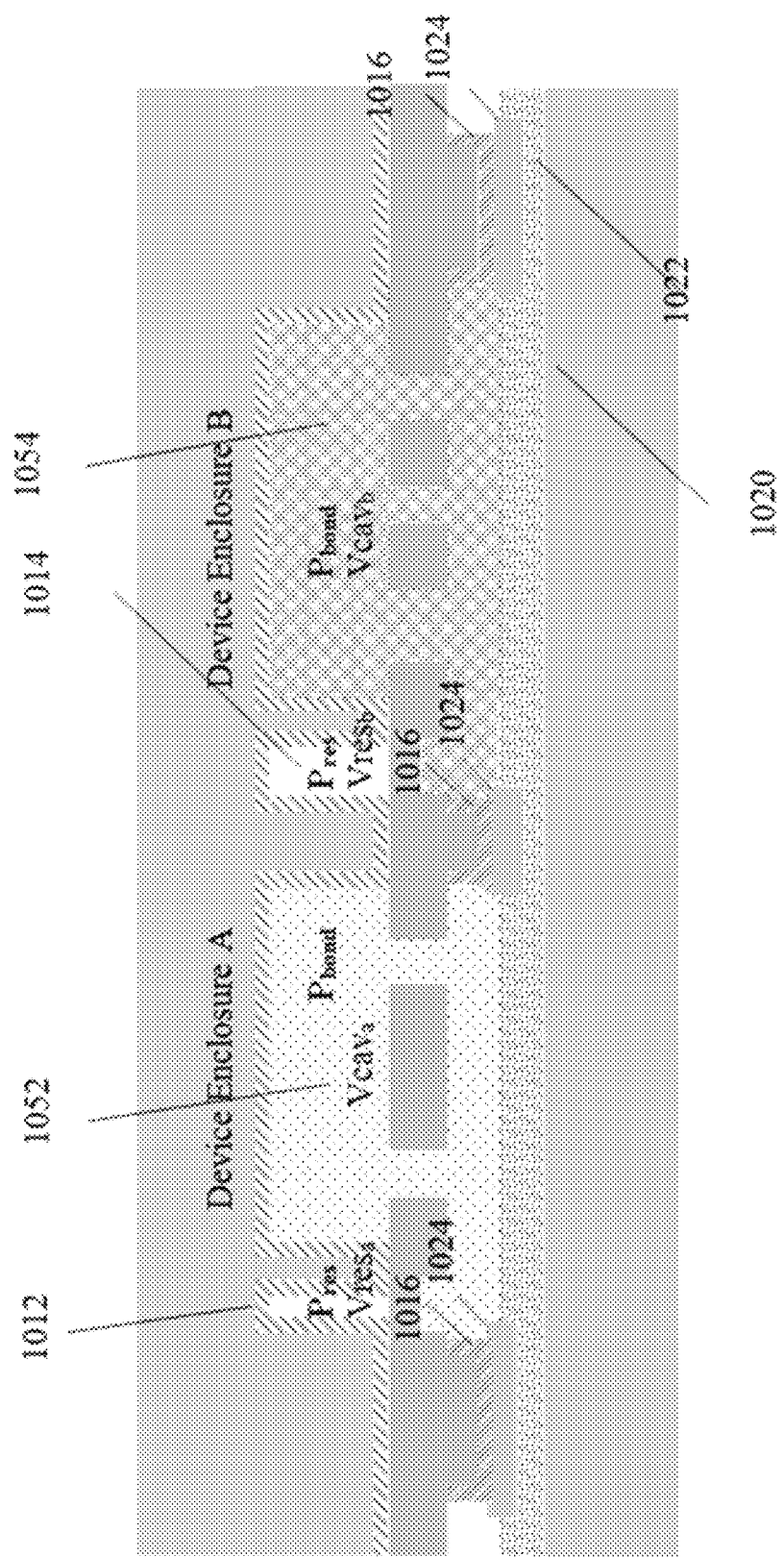
FIG. 32 illustrates the cross-section of a CMOS-MEMS wafer after the MEMS and CMOS wafers were bonded eutecticly in ambient II under bonding pressure $P_{bond}$.
Figure 33:
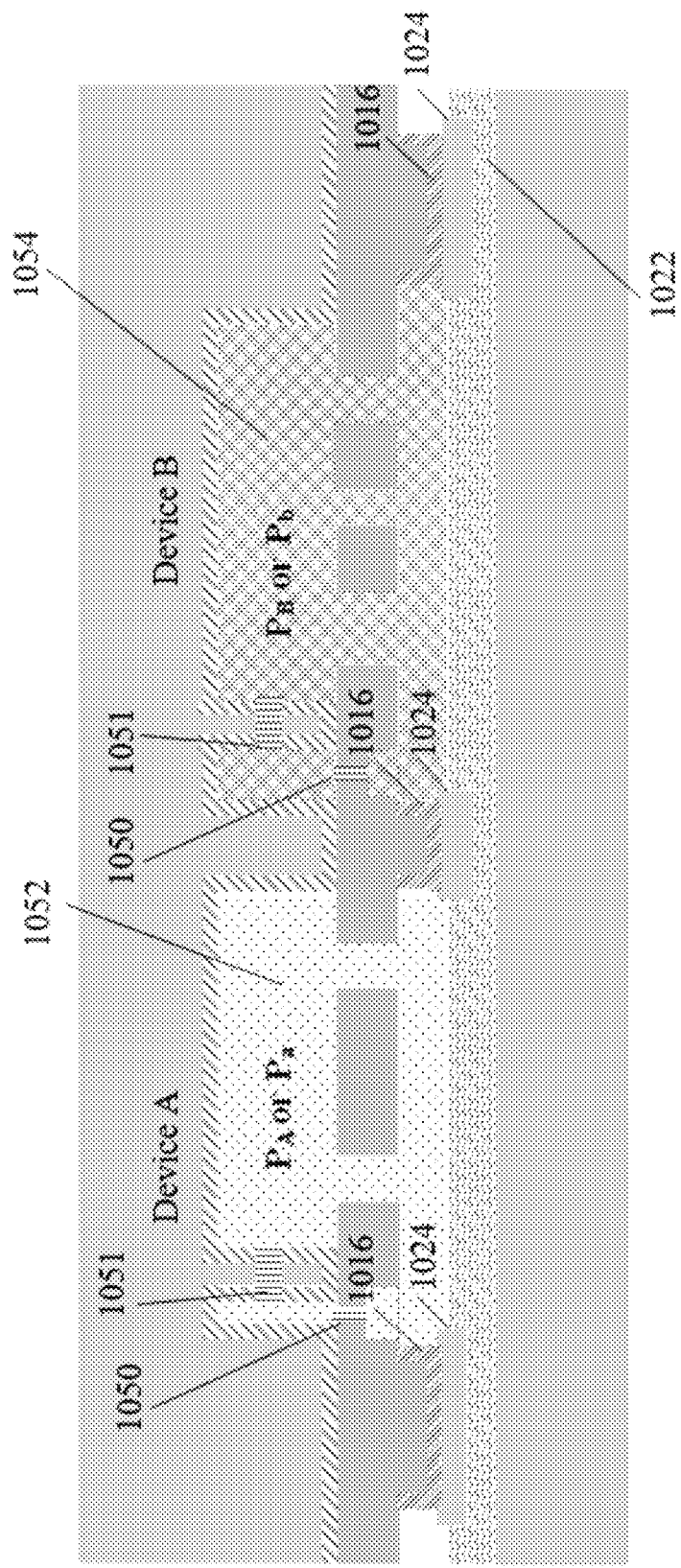
FIG. 33 illustrates Laser Stealth Dicing which is used to open or breach the Si membranes between the internal gas reservoirs and device enclosures.

Specifically, with reference to FIG. 32, it will be appreciated that from a method and system in accordance with the present invention:

$$P_{res}*Vres_a=\lambda res_a RT \qquad (Eq\ 1)$$

where $P_{res}$ is pressure in reservoir A that has volume $Vres_a$, and $\lambda res_a$ is a number on moles of gas in this reservoir. Similar equation can be written for the enclosure A.

$$P_{bond}*Vcav_a=\lambda cav_a RT \qquad (Eq\ 2)$$

Combining these two equations gives a formula defining final pressure in joined volume (after breaking silicon membranes by LSD).

$$P_a = \frac{Pres_a \cdot Vres_a + P_{bond} \cdot Vcav_a}{Vres_a + Vcav_a} \qquad (Eq\ 3)$$

Generalizing to reservoir i and enclosure i one gets $$P_i = \frac{Pres_i \cdot Vres_i + P_{bond} \cdot Vcav_i}{Vres_i + Vcav_i} \qquad (Eq\ 4)$$

which is the final cavity pressure of that particular device with internal gas reservoir of $Vres_i$ and device enclosure $Vcav_i$ within a die, where i=a, b, c, . . . (or A, B, C,).

Approach D: Controlled Leak/Breach

FIGS. 34-44 set forth three approaches for a method for integrating at least two MEMS devices in hermetically sealed enclosures of different pressures or gas compositions on the same die. The Controlled Leak/Breach method in accordance with the present invention allows for multiple pressure and/or gas composition via a single bond step and post-bonding process steps.

Figure 34:
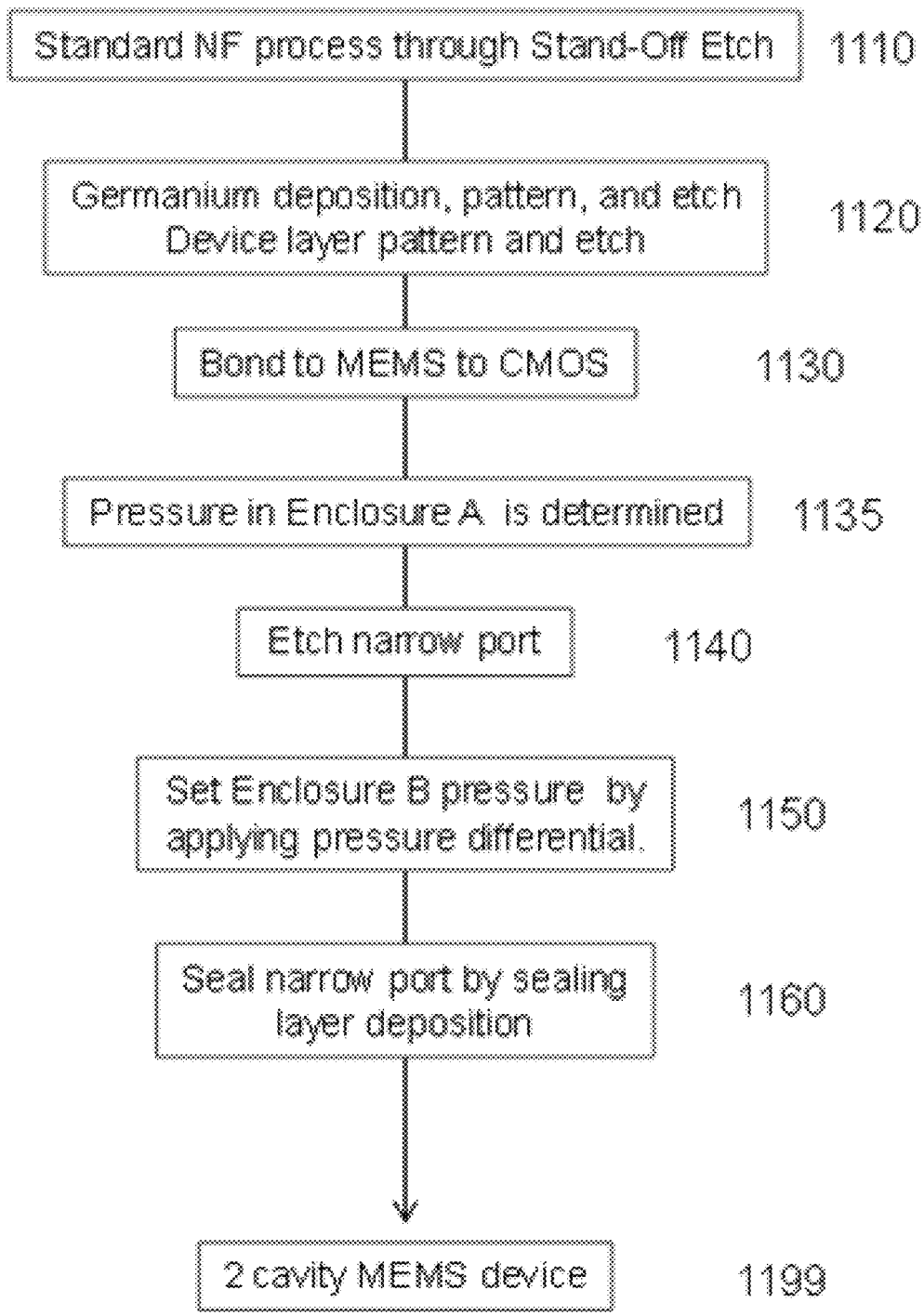
FIG. 34 sets forth a process for integrating two sealed enclosures, in accordance with one or more embodiments, whereby a port is open connecting to or proximate to enclosure B, allowing setting pressure of enclosure B independently from enclosure A. The port is then sealed using a deposited sealing material.

From FIG. 34, at 1110, a starting material (Standard Nasiri-Fabrication process through Stand-Off etch) is set forth. Next, a device layer pattern and DRIE occurs at 1120, then a bonding to the CMOS wafer at 1130. At 1140, a narrow pressure port channel is etched. At 1150, the pressure inside Enclosure B is brought to a desired level by applying an appropriate pressure differential between the wafer stack and the ambient. Then at 1160, the pressure port channel is sealed by depositing a sealing material. At 1199, a two cavity (or enclosure) MEMS device is provided.

Figure 35:
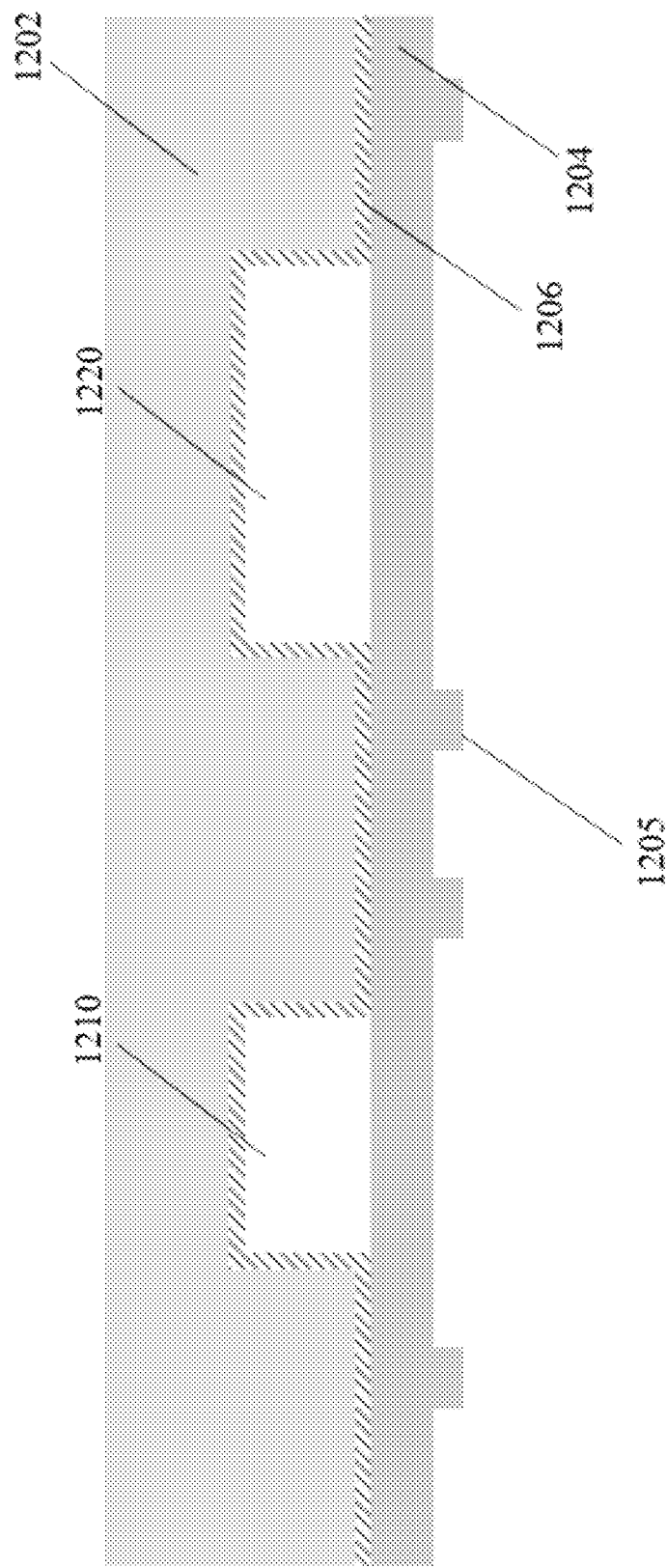
FIG. 35 illustrates the cross-sectional view of a starting material (Standard Nasiri-Fabrication process through stand-off etch).

FIG. 35 illustrates the cross-section view of a starting material having a handle wafer 1202 with etched cavities 1210 and 1220 and a device wafer 1204, standoff 1205, and oxide thin film 1206.

Figure 36:
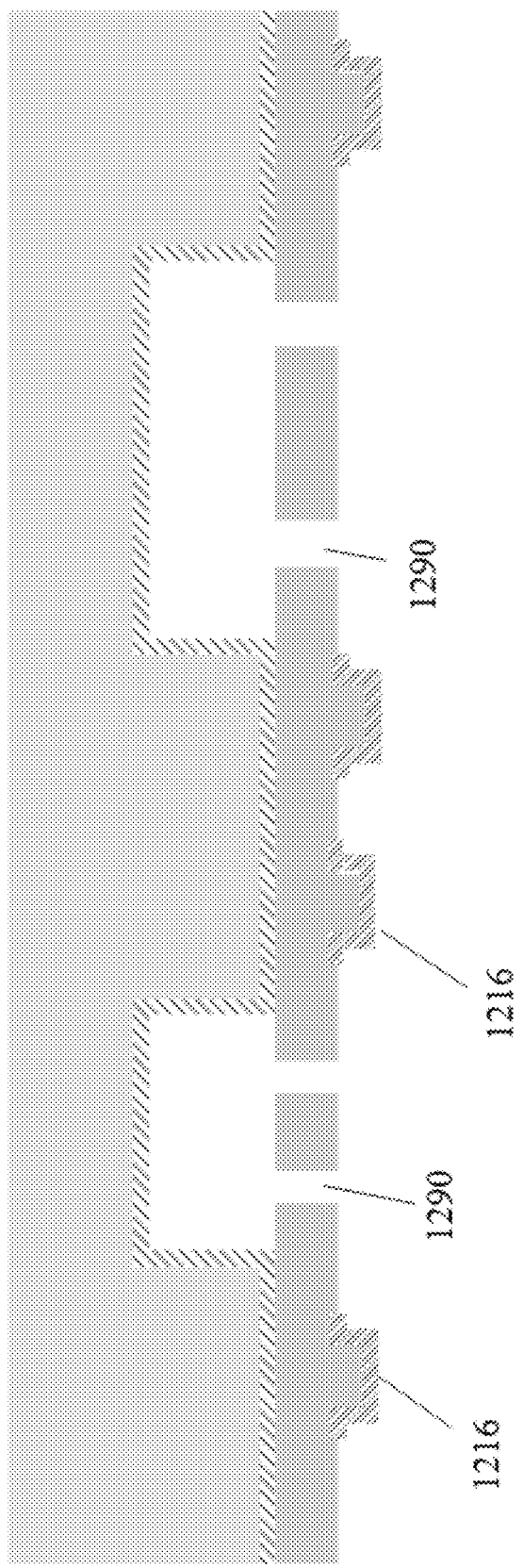
FIG. 36 illustrates a device layer pattern and DRIE etch of the device layer.

FIG. 36 illustrates a number of process steps including Ge deposition/pattern/etch 1216 and a device actuator pattern and etch 1290, providing MEMS wafer 1220.

Figure 37:
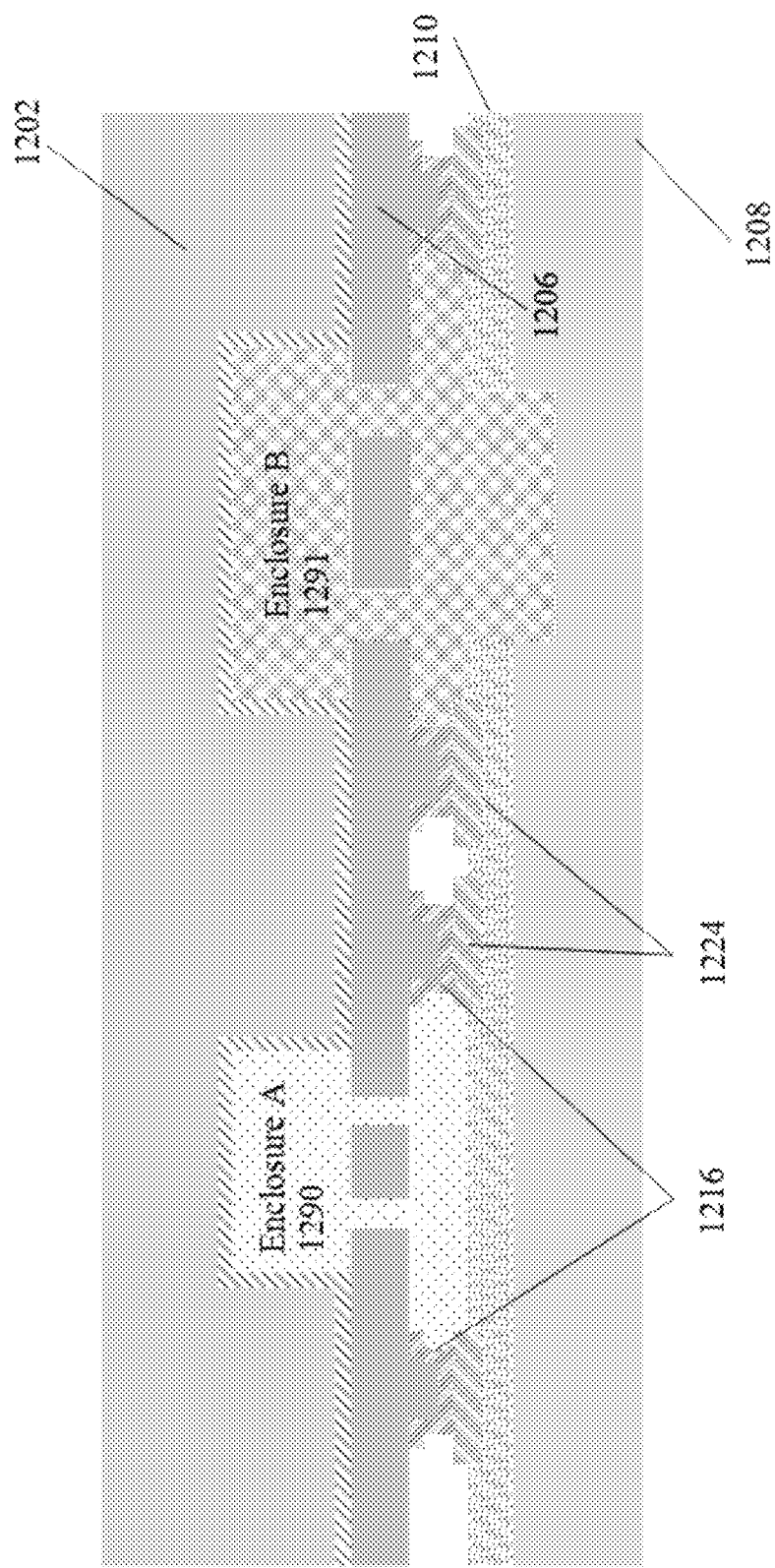
FIG. 37 illustrates a MEMS wafer bonding to the CMOS wafer; at this point both enclosures A and B have the same pressure, $P_{bond}$.

FIG. 37 illustrates a step of bonding the MEMS wafer 1220 to a CMOS wafer 1208 by an eutectic bond of Ge 1216 and Al 1224; at this point both enclosures A and B (1290 and 1291) have the same pressure, $P_{bond}$.

Figure 38:
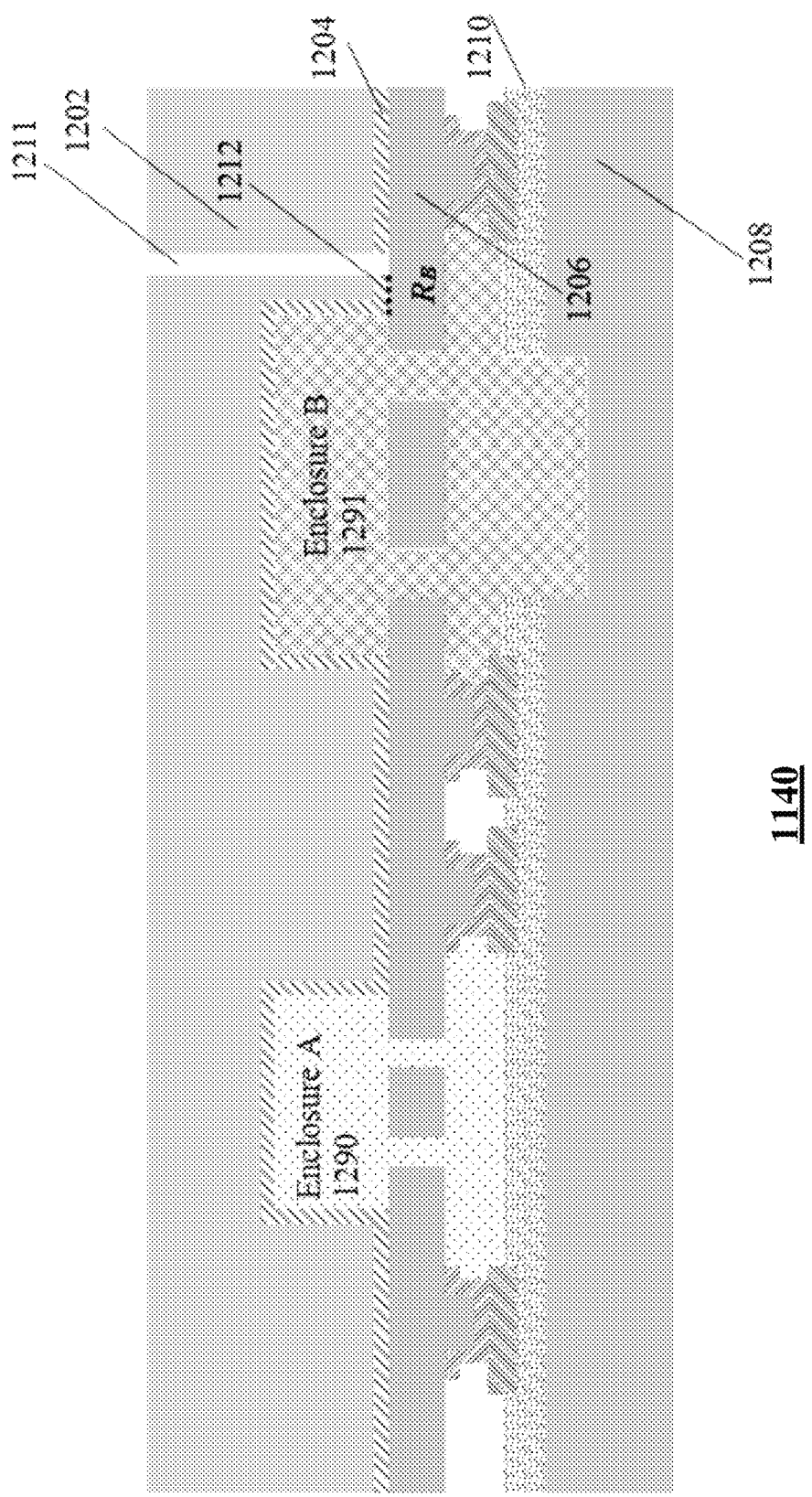
FIG. 38 illustrates etch of a narrow pressure port channel, stopping at silicon oxide; oxide etching is continued; stopping at device layer Si. Pressure port channel is positioned in such a way that gas flow resistance, $R_B$, between the channel and the enclosure B is high but finite.

FIG. 38 illustrates a step of etching a narrow pressure port channel 1211 proximate to enclosure B 1291, stopping at silicon oxide 1204; oxide etching then continued; stopping at device Si 1206. Pressure port channel is positioned in such a way that gas flow resistance 1212, $R_B$ between the channel 1211 and the enclosure B 1291 is high but finite.

Figure 39:
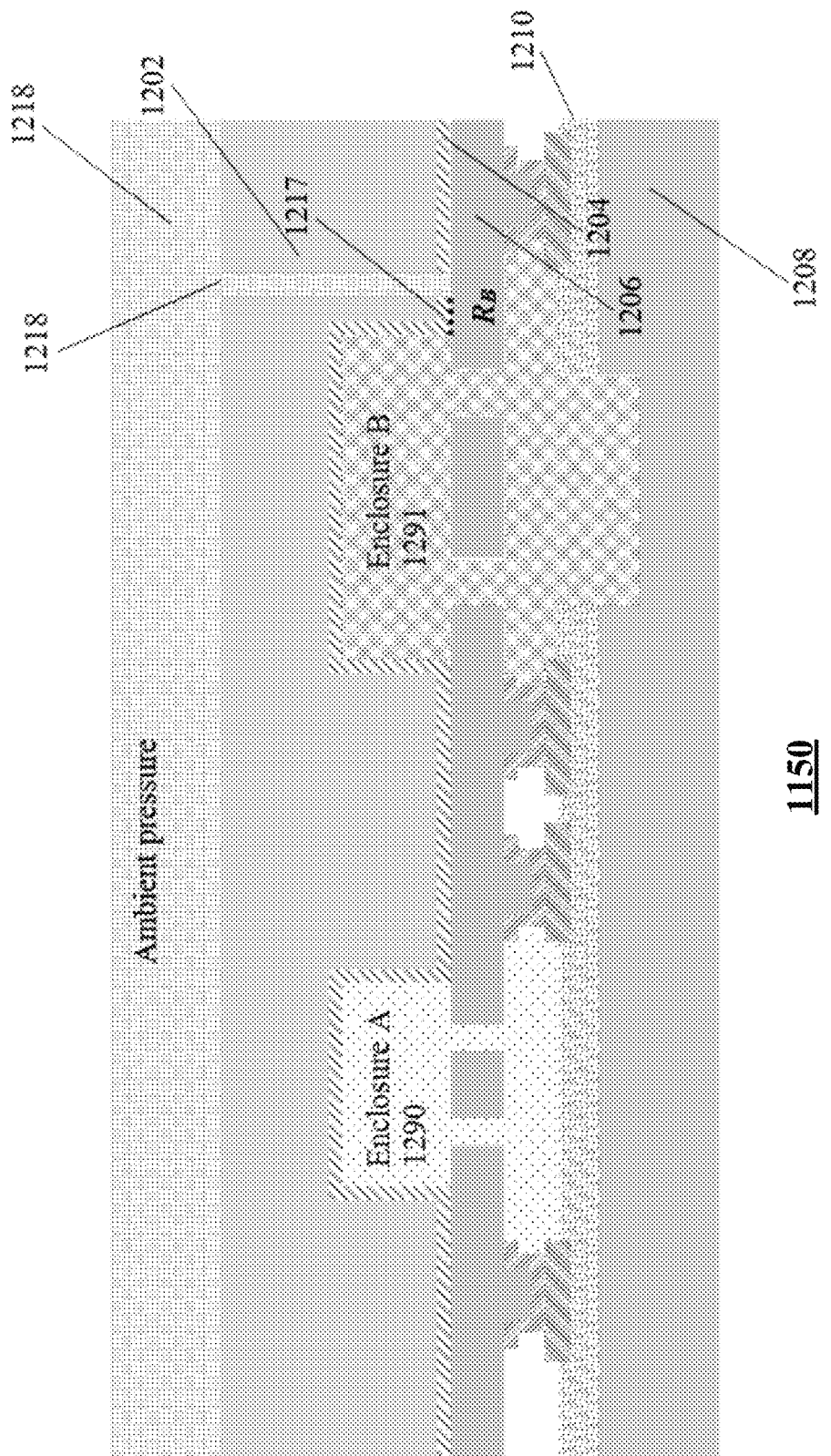
FIG. 39 illustrates bringing the pressure inside enclosure B to the desired level by applying appropriate pressure differential between the wafer stack and the ambient.

FIG. 39 illustrates a step to bring the pressure inside enclosure B 1291 to the desired level by applying appropriate pressure differential between the internal pressure of enclosure B 1291 and the outside ambient 1218. Further the ambient pressure 1218 $P_{amb}$ is preferably brought down to such a level that controlled gas leakage through the flow resistance $R_B$ brings the pressure in enclosure B 1291 to a desired level. Controlled gas leakage can be either into or out of enclosure B 1291 depending on the sign of the pressure differential, therefore final pressure in enclosure B 1291 $P_B$ can be either lower or higher then pressure $P_A$ in enclosure A 1290, which remains equal to $P_{bond}$.

Figure 40:
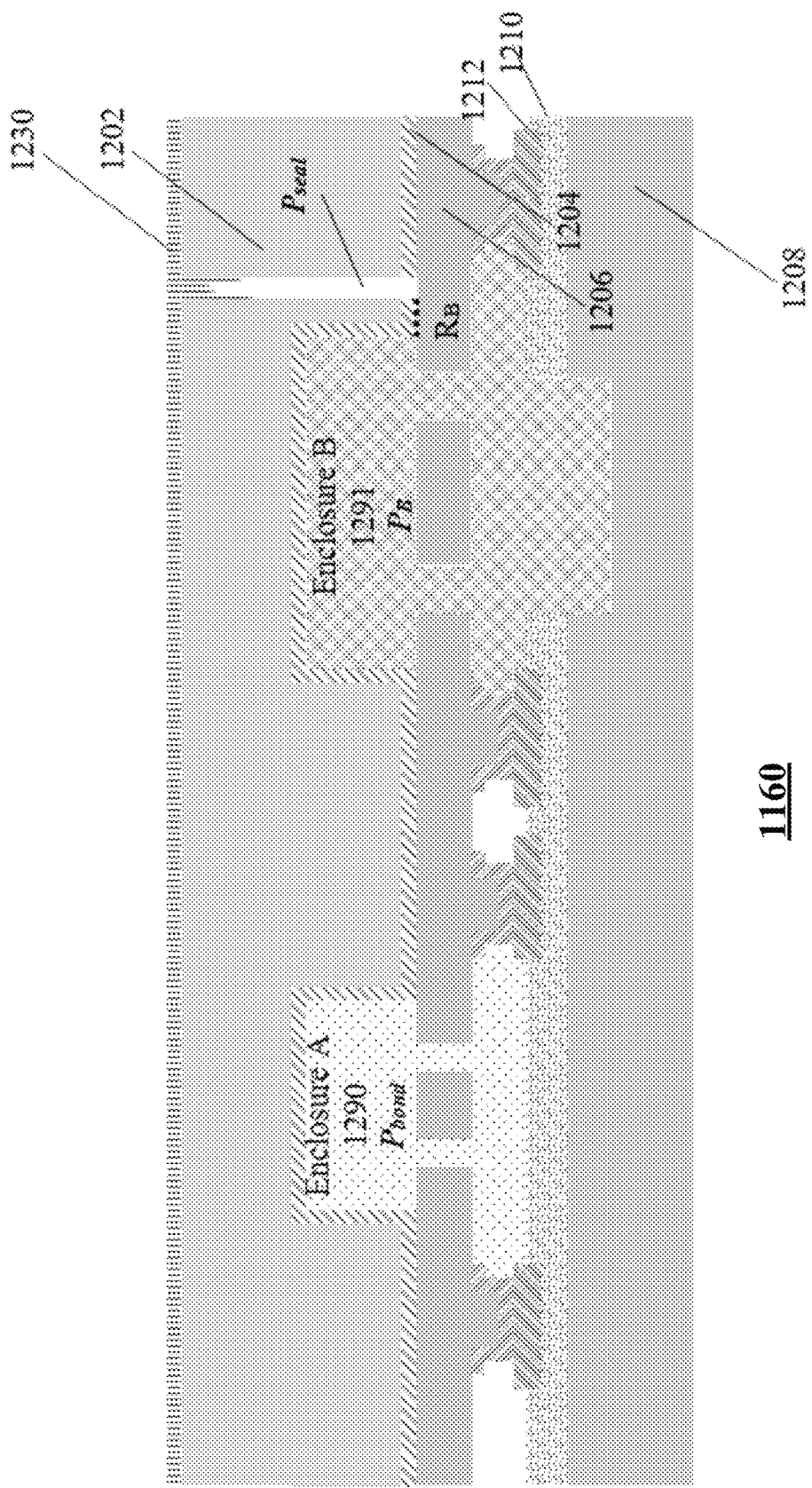
FIG. 40 illustrates sealing the pressure port channel by depositing sealing material, for example, polysilicon or metal; $P_B$ is determined by differential pressure, flow resistance $R_B$ and seal pressure $P_{seal}$.

FIG. 40 illustrates a step of sealing the pressure port channel by depositing sealing material 1230, for example polysilicon, or metal; $P_B$ is determined by the differential pressure in step 1150, flow resistance $R_B$, and the sealing pressure $P_{seal}$. FIG. 40 further illustrates that the pressure $P_{seal}$ at which sealing is performed is typically different from $P_{amb}$. Therefore, while sealing is taking place, pressure in Enclosure B 1291 will change. However, because the flow resistance $R_B$ is relatively high, this change can be relatively small. Thus a method and system in accordance with the present invention may benefit by setting pressure in Enclosure B ($P_B$) to be substantially different from pressure in Enclosure A ($P_A$) and from the sealing pressure $P_{seal}$.

By extension, MEMS devices may now have more than two enclosed cavities and more than two pressure port channels. Leak resistances $R_B$, $R_c$, etc. are provided by the design and can be controlled as desired to achieve $P_A$, $P_B$, $P_c$, etc. as desired. All of the channels, however, are sealed off at once at the same pressure $P_{seal}$.

This embodiment, for this approach, provides the added benefit of having enclosure B being substantially isolated and protected during manufacturing steps, such as dicing and sawing, from particles and moisture present at these steps.

Figure 41:
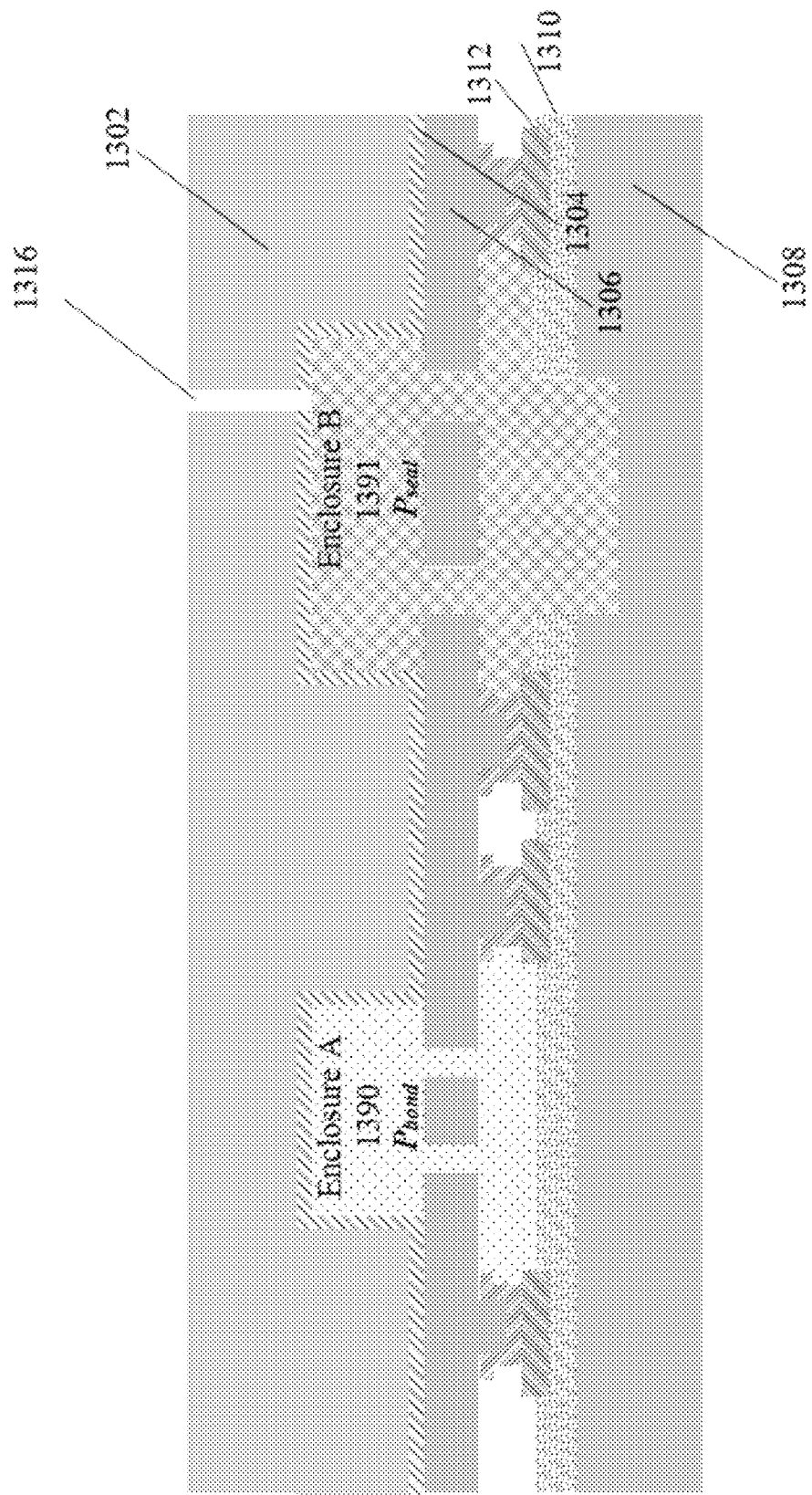
FIG. 41 illustrates another embodiment of the solution described in FIG. 34. Here the vertical pressure port channel leads directly to the enclosure B.
Figure 42:
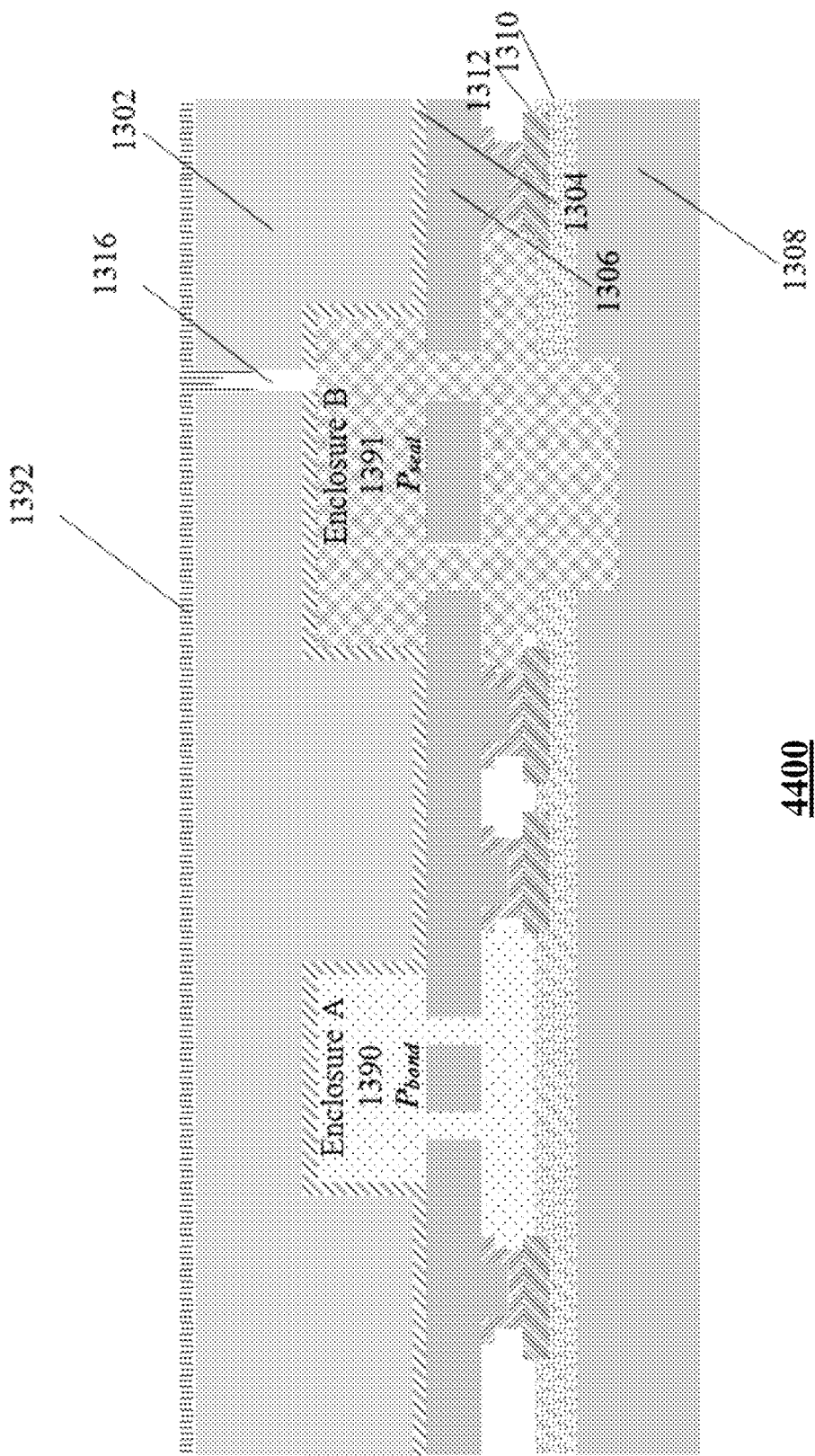
FIG. 42 illustrates sealing the pressure port channel by depositing sealing material, for example, polysilicon or metal; in this embodiment enclosure B pressure $P_B$ is equal to seal pressure $P_{seal}$.

FIGS. 41-42 set forth a second approach for a method for integrating at least two MEMS devices in hermetically sealed enclosures of different pressure or gas composition in a same die.

FIG. 41 illustrates another embodiment of the solution described in Controlled Leak/Breach method. Here the vertical pressure port channel 1316 leads directly to the enclosure B 1391. Preferably, in one or more embodiments, $P_B$ is equal to $P_{seal}$. This embodiment provides additional benefits of providing an implementable solution for creating multiple cavities with two levels of pressure.

FIG. 42 illustrates sealing the pressure port channel 1316 by depositing sealing material 1392, for example, polysilicon or metal; in this embodiment $P_B$ is equal to $P_{seal}$.

Figure 43:
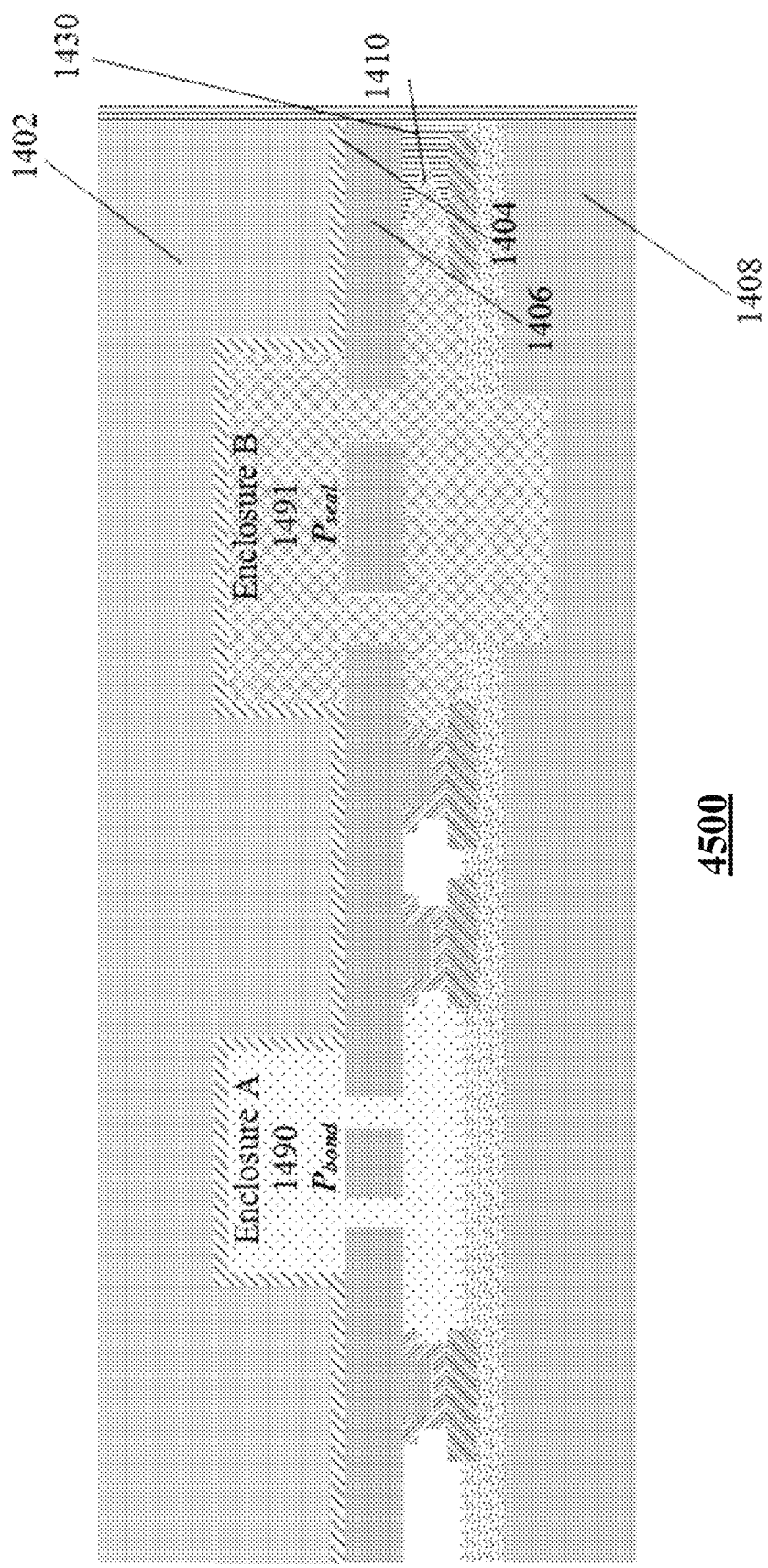
FIG. 43 illustrates another embodiment of the solution described in FIG. 34. In this instance the pressure port channel leading to the enclosure B is horizontal and is formed by stand-off features of standard NF processes, or by the absence of Ge layer resulting in no eutectic bond. In this embodiment $P_B$ is equal to $P_{seal}$.
Figure 44:
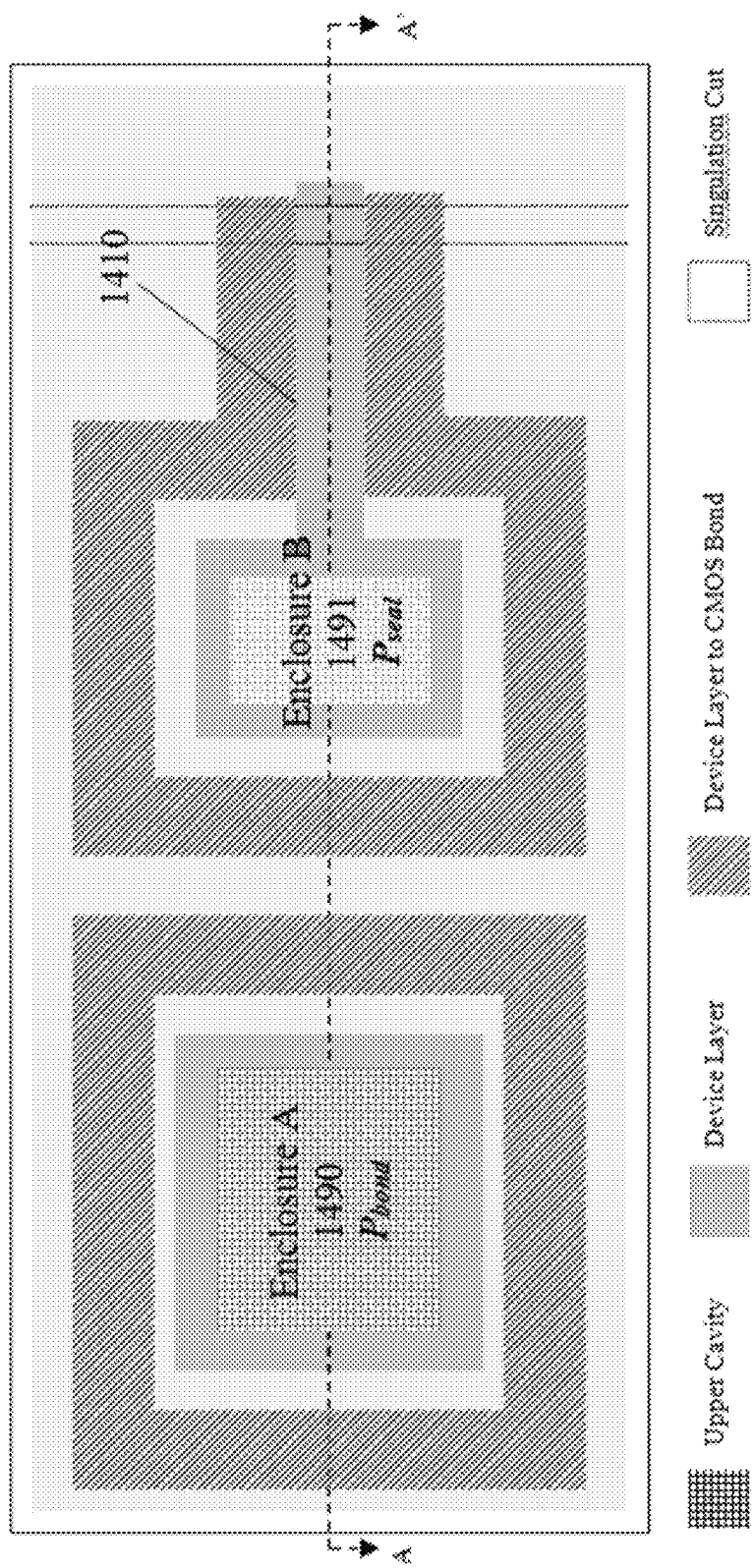
FIG. 44 illustrates a top view of embodiment shown in FIG. 43, in which enclosure B is exposed to the environment through a side-channel formed by stand-off features of standard NF process, or by the absence of Ge layer resulting in no eutectic bond. In this embodiment $P_B$ is equal to $P_{seal}$.

FIGS. 43-44 set forth a third approach for a method for integrating at least two MEMS devices in hermetically sealed enclosures of different pressure or gas composition in a same die. The Controlled Leak/Breach method in accordance with the present invention allows for multiple pressure and/or gas composition via the single bond step and post-bonding steps, where the pressure port channel 1410 leading to the enclosure B 1491 is horizontal and formed by a stand-off feature of the standard NF process, or by absence of Ge layer resulting in no bond. The side channel 1410 is sealed by depositing a sealing material 1430, for example polysilicon or metal. In this embodiment $P_B$ is equal to $P_{seal}$.

FIG. 44 illustrates a top view of the embodiment shown in FIG. 43, in which enclosure B 1491 is exposed to the environment through a side-channel 1410 formed by standoff features of standard NF process, or by absence of Ge layer resulting in no bond; in this embodiment $P_B$ is equal to $P_{seal}$.

Although the present invention has been described in accordance with the embodiments shown, one of ordinary skill in the art will readily recognize that there could be variations to the embodiments and those variations would be within the spirit and scope of the present invention, such as the inclusion of circuits, electronic devices, control systems, and other electronic and processing equipment. Accordingly, many modifications may be made by one of ordinary skill in the art without departing from the spirit and scope of the appended claims. Many other embodiments of the present invention are also envisioned.

Any theory, mechanism of operation, proof, or finding stated herein is meant to further enhance understanding of the present invention and is not intended to make the present invention in any way dependent upon such theory, mechanism of operation, proof, or finding. It should be understood that while the use of the word preferable, preferably or preferred in the description above indicates that the feature so described may be more desirable, it nonetheless may not be necessary and embodiments lacking the same may be contemplated as within the scope of the invention, that scope being defined by the claims that follow.

What is claimed is:

1. A Microelectromechanical Systems (MEMS) structure comprising:
   a MEMS substrate bonded to a second substrate, forming a plurality of enclosures of at least two types,
      wherein each of the plurality of enclosures is defined by the MEMS substrate, the second substrate, and a seal-ring between the MEMS substrate and the second substrate,
      wherein a first enclosure type has a first seal-ring type,
      wherein a second enclosure type has a second seal-ring type, and
      wherein the second enclosure type comprises a gap of the seal-ring of the second seal-ring type configured to allow a pressure differential between first enclosure type and the second enclosure type upon sealing the second enclosure type.

2. The MEMS structure of claim 1, wherein the gap is defined by a predetermined separation of the second seal-ring type in a plane substantially parallel to the MEMS substrate.

3. The MEMS structure of claim 1, wherein the gap is defined by a difference in thickness of the first seal-ring type relative to the second seal-ring type and the second substrate, wherein the gap lies in a plane substantially orthogonal to the MEMS substrate.

4. The MEMS structure of claim 1, wherein the gap is defined by a dielectric layer between a MEMS device wafer and a MEMS handle wafer of the MEMS substrate.

5. The MEMS structure of claim 1, wherein the first enclosure type is sealed with the first seal-ring at a first pressure, at a first temperature, and at a first force applied to the MEMS substrate and the second substrate.

6. The MEMS structure of claim 1, wherein the second enclosure type is sealed with the second seal-ring type at a second pressure, at a second temperature, and at a second force applied to the MEMS substrate and the second substrate.

7. The MEMS structure of claim 6, wherein at least one of the second temperature or the second force applied is at a predetermined value to seal the gap in the second enclosure type.

8. The MEMS structure of claim 1, wherein the second substrate comprises a complementary metal-oxide semiconductor (CMOS) substrate.

9. The MEMS structure of claim 1, wherein at least one of the first seal-ring type or the second seal-ring type comprises solder.

10. A method, comprising:
    forming a Microelectromechanical Systems (MEMS) substrate with cavities;
    contacting the MEMS substrate with a second substrate, thereby forming a plurality of enclosures of at least two types, wherein each of the plurality of enclosures is defined by the MEMS substrate, the second substrate, and a seal-ring between the MEMS substrate and the second substrate, wherein a first enclosure type has a first seal-ring type, wherein a second enclosure type has a second seal-ring type, wherein the second enclosure type comprises a gap of the seal ring of the second seal-ring type configured to allow a pressure differential between first enclosure type and the second enclosure type upon sealing the second enclosure type; and
    bonding the MEMS substrate with the second substrate.

11. The method of claim 10, wherein the forming the MEMS substrate comprises forming the MEMS substrate such that the gap is defined by a predetermined separation of the second seal-ring type in a plane substantially parallel to the MEMS substrate.

12. The method of claim 10, wherein the forming the MEMS substrate comprises forming the MEMS substrate such that the gap is defined by a difference in thickness of the first seal-ring type relative to the second seal-ring type and the second substrate, wherein the gap lies in a plane substantially orthogonal to the MEMS substrate.

13. The method of claim 10, wherein the forming the MEMS substrate comprises forming the MEMS substrate such that the gap is defined by a dielectric layer between a MEMS device wafer and a MEMS handle wafer of the MEMS substrate.

14. The method of claim 13, further comprising:
    forming a port through the MEMS handle wafer and dielectric layer proximate to the second enclosure type to establish gas flow resistance from the port to the second enclosure type via the gap;
    establishing a gas pressure and a gas composition at a predetermined value and a predetermined time to obtain, via controlled gas leak through the gap, a predetermined pressure and predetermined gas composition in the second enclosure type;
    sealing off the port by depositing a sealing material.

15. The method of claim 10, wherein the boding comprises sealing the first enclosure type with the first seal-ring at a first pressure, at a first temperature, and at a first force applied to the MEMS substrate and the second substrate.

16. The method of claim 10, wherein the boding comprises sealing the second enclosure type with the second seal-ring type at a second pressure, at a second temperature, and at a second force applied to the MEMS substrate and the second substrate.

17. The method of claim 16, wherein the sealing the second enclosure type with the second seal-ring type comprises applying at least one of the second temperature or the second force applied at a predetermined value to seal the gap in the second enclosure type.

18. The method of claim 17, wherein the sealing the second enclosure type comprises reflowing solder associated with at least one of the first seal-ring type or the second seal-ring type to seal the gap in the second enclosure type.

19. The method of claim 10, wherein the contacting the MEMS substrate with the second substrate and the bonding the MEMS substrate with the second substrate comprises contacting the MEMS substrate with a complementary metal-oxide semiconductor (CMOS) substrate and bonding the MEMS substrate with the CMOS substrate.

* * * * *